(12) United States Patent  
Ogiso et al.

(10) Patent No.: US 8,779,359 B2  
(45) Date of Patent: Jul. 15, 2014

(54) DEFECT REVIEW APPARATUS AND DEFECT REVIEW METHOD

(75) Inventors: Yoshiaki Ogiso, Tokyo (JP); Isao Yonekura, Tokyo (JP)

(73) Assignees: Advantest Corp., Tokyo (JP); Toppan Printing Co., Ltd., Tokyo (JP)

( * ) Notice: Subject to any disclaimer, the term of this patent is extended or adjusted under 35 U.S.C. 154(b) by 317 days.

(21) Appl. No.: 13/317,317

(22) Filed: Oct. 14, 2011

(65) Prior Publication Data

US 2012/0112066 A1   May 10, 2012

(30) Foreign Application Priority Data

Nov. 5, 2010   (JP) .................................. 2010-248446  
Apr. 11, 2011   (JP) .................................. 2011-087197

(51) Int. Cl.
```
G01N 23/225    (2006.01)
H01J 37/28     (2006.01)
H01J 37/26     (2006.01)
H01J 37/24     (2006.01)
G06T 7/00      (2006.01)
H01L 21/66     (2006.01)
```
(52) U.S. Cl.  
CPC ......... *G06T 7/001* (2013.01); *H01J 2237/2817* (2013.01); *H01J 2237/24495* (2013.01); *H01J 2237/221* (2013.01); *H01L 22/12* (2013.01)  
USPC .......................................... 250/310; 250/307

(58) Field of Classification Search  
USPC .................... 250/306, 307, 310, 311, 396 R, 250/397–399, 442.11, 492.3  
See application file for complete search history.

(56) References Cited

U.S. PATENT DOCUMENTS

| | | | |
|---|---|---|---|
| 3,329,813 A | | 7/1967 | Hashimoto |
| 4,767,926 A | * | 8/1988 | Murakoshi et al. ........... 250/310 |
| 5,001,344 A | * | 3/1991 | Kato et al. ................... 250/307 |
| 5,644,132 A | * | 7/1997 | Litman et al. ................ 250/310 |
| 7,977,632 B2 | * | 7/2011 | Todokoro et al. ............ 250/310 |
| 8,604,431 B2 | * | 12/2013 | Murakawa et al. .......... 250/310 |

(Continued)

FOREIGN PATENT DOCUMENTS

| | | |
|---|---|---|
| JP | H1-115043 | 5/1989 |
| JP | 03-192645 | 8/1991 |

(Continued)

OTHER PUBLICATIONS

English translation of office action issued by German Patent Office for German Application No. 10 2100 054 537.9.

(Continued)

*Primary Examiner* — Bernard E Souw  
(74) *Attorney, Agent, or Firm* — Muramatsu & Associates

(57) ABSTRACT

A defect review apparatus includes: an electron scanning part which irradiates and scans an electron beam over an observation region on a surface of a sample; four electron detectors arranged around the optical axis of the electron beam with 90° intervals; and a signal processing unit which generates multiple pieces of image data of the observation region on the basis of detection signals from the electron detectors, the multiple pieces of image data respectively taken in different directions. When a pattern in the observation region is a line-and-space pattern, the defect inspection unit performs defect detection on the basis of a subtract between two pieces of the image data respectively taken in two predetermined directions with the optical axis of the electron beam in between.

14 Claims, 26 Drawing Sheets

(56) References Cited

U.S. PATENT DOCUMENTS

| | | |
|---|---|---|
| 2004/0159787 A1* | 8/2004 | Nakasuji et al. .............. 250/311 |
| 2008/0121804 A1* | 5/2008 | Nakasuji et al. .............. 250/310 |
| 2009/0039259 A1* | 2/2009 | Todokoro et al. .............. 250/307 |
| 2012/0049362 A1* | 3/2012 | Masuda et al. ................ 257/738 |
| 2012/0217392 A1* | 8/2012 | Murakawa et al. ............. 250/307 |
| 2012/0318976 A1* | 12/2012 | Matsumoto et al. ........... 250/307 |
| 2013/0264480 A1* | 10/2013 | Murakawa et al. ............. 250/307 |

FOREIGN PATENT DOCUMENTS

| | | |
|---|---|---|
| JP | 10-321130 | 12/1998 |
| JP | 2009-141124 | 6/2009 |
| JP | 2010-112944 | 5/2010 |

OTHER PUBLICATIONS

S. Harada et al. "A new CDSEM metrology method for thin film hardmasks patterns using multiple detectors", Photomask Technology 2010, Proceeding of SPIE, vol. 7823.

Office action issued by Korean Patent Office for counterpart Korean application and its English translation.

Office action issued by Japanese Patent Office for the counterpart Japanese application and its English translation.

* cited by examiner

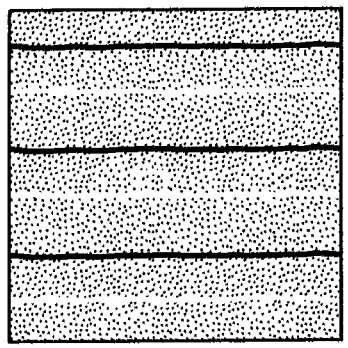
Fig. 15A
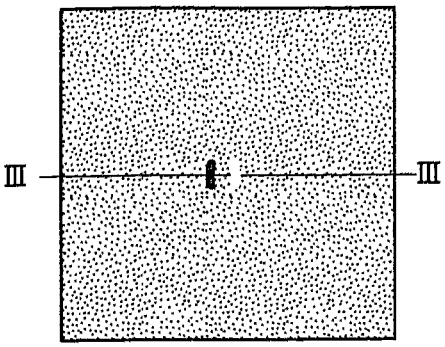
Fig. 15B
Fig. 16A
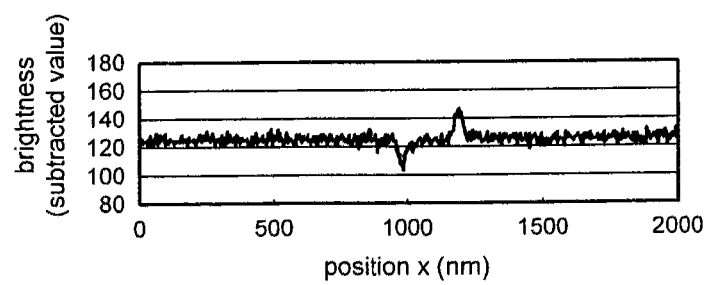
Fig. 16B
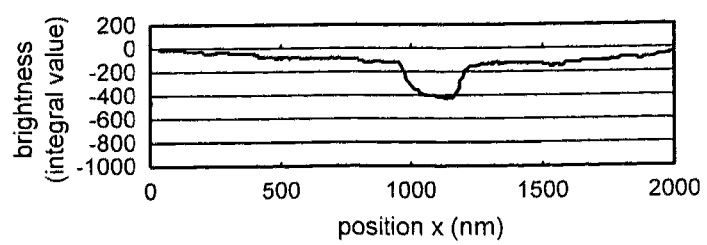

DEFECT REVIEW APPARATUS AND DEFECT REVIEW METHOD

CROSS-REFERENCE TO RELATED APPLICATIONS

This application is based on and claims priority of Japanese Patent Application No. 2010-248446 filed on Nov. 5, 2010, and No. 2011-087197 filed on Apr. 11, 2011, the entire contents of which are incorporated herein by reference.

BACKGROUND OF THE INVENTION

1. Field of the Invention

The present invention relates to a defect review apparatus and a defect review method, and particularly relates to a defect review apparatus and a defect review method in which an observation of a defect is performed by irradiating a surface of a sample with an electron beam.

2. Description of the Related Art

Recently, patterns of wafers, photomasks, and the like have become finer due to finer designing of semiconductor devices, and finer defects have become more apt to largely affect the manufacturing yield. Thus, importance of defect inspection is increasing.

In such defect inspection of wafers and photomasks, an inspection using an optical inspection apparatus with high throughput is firstly performed. The optical inspection apparatus can detect an extremely fine defect, for example, a defect which is of 10 nm or smaller. However, due to limitations in resolution, the optical inspection apparatus cannot determine the shape of the defect.

In this respect, when a defect is detected by the optical inspection apparatus, the position, shape, and size of the defect are checked in a subsequent defect review process. In the defect review process, a scanning electron microscope (SEM) is used, and the shape of a fine defect which could not be measured by the optical inspection apparatus is measured based on a high resolution SEM image.

Moreover, Japanese Application Laid-Open Publication No. H3-192645 discloses a method of observing the shape of the surface of a sample three-dimensionally by using a scanning electron microscope in which multiple (two) electron detectors are installed.

In the defect review process described above, the defect has to be specified first in the SEM image. In this respect, the defect is detected by performing pattern matching (comparison process) between the SEM image of the sample and, for example, design data which represents a pattern with no defect.

However, a large amount of calculation is required in the defect detection by pattern matching, which takes a relatively long period. Thus, there is a problem that the defect review cannot be performed speedily.

SUMMARY OF THE INVENTION

An object of the present invention is to provide a defect review apparatus and a defect review method by which a defect review can be performed speedily.

The present invention provides a defect review apparatus including: an electron scanning part which irradiates an observation region of a surface of a sample with an electron beam and which scans the electron beam over the observation region; a plurality of electron detectors which are arranged around an optical axis of the electron beam and which detect electrons emitted from the surface of the sample by the irradiation of the electron beam; a signal processing unit which generates a plurality of pieces of image data of the observation region on the basis of detection signals from the electron detectors, the plurality of pieces of image data respectively taken in different directions; and a defect inspection unit which generates a subtract image by taking a subtract between each two of the plurality of pieces of image data and which detects a defect in the observation region on the basis of the subtract image.

In the defect review apparatus, when a pattern in the observation region is a line-and-space pattern including a line pattern and a space, the defect inspection unit may generate the subtract image by taking the subtract between two pieces of the image data respectively taken in two directions which are parallel to an extending direction of the line pattern and face each other with the optical axis of the electron beam in between, and then detect a pattern remaining in the subtract image as a defect.

Another aspect of the present invention is a defect review method including the steps of: irradiating and scanning a surface of a sample with an electron beam, and detecting electrons emitted from the surface of the sample by the irradiation of the electron beam with a plurality of electron detectors arranged around an optical axis of the electron beam; generating a plurality of pieces of image data of the observation region on the basis of detection signals from the electron detectors, the plurality of pieces of image data being taken in respective directions; and generating a subtract image by taking a subtract between each two of the plurality of pieces of image data, and detecting a defect in the observation region on the basis of the subtract image.

According to the defect review apparatus and defect review method described above, the subtract image in which only the defect is shown is generated by taking the subtract between each two of the multiple pieces of image data. Thus, the defect can be easily and speedily detected, and the defect review can be performed speedily.

BRIEF DESCRIPTION OF THE DRAWINGS

FIGS. 15A and 15B are views showing an SEM image and a subtract image of a sample of Example 2, respectively.

FIGS. 16A and 16B are graphs showing a subtract profile and an integration profile of a defect in Example 2, respectively.

DESCRIPTION OF THE EMBODIMENT

An embodiment will be described below with reference to the attached drawings.

Figure 1:
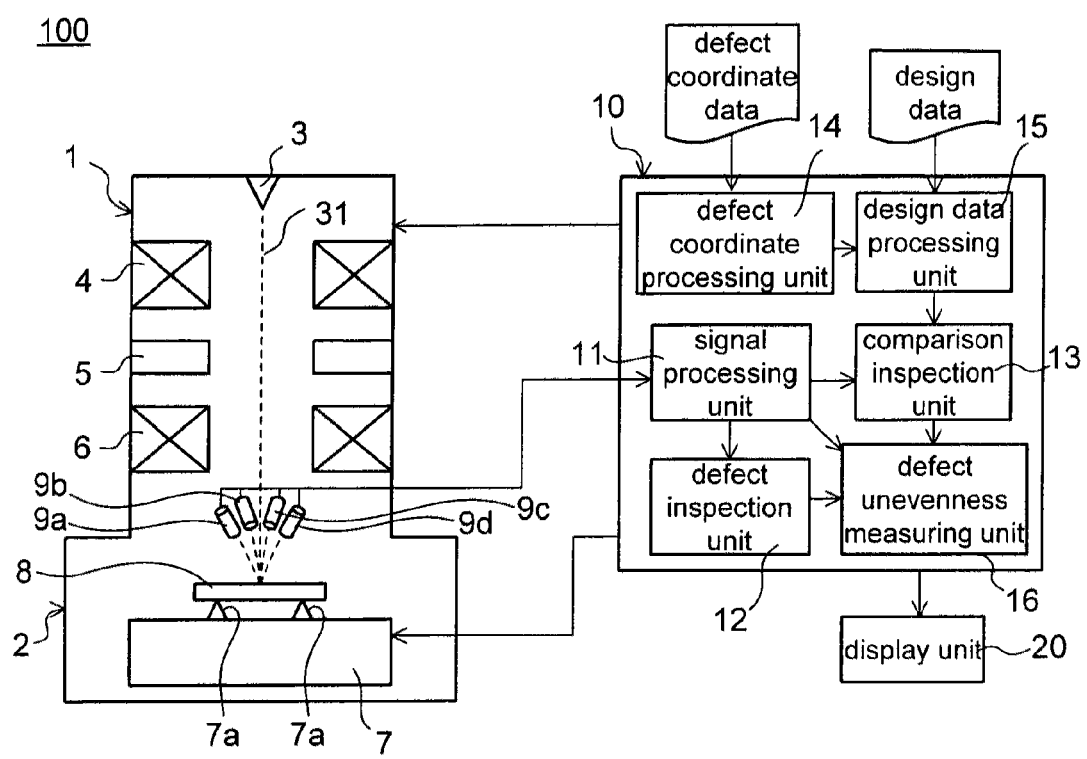
FIG. 1 is a block diagram showing a defect review apparatus according to an embodiment.
Figure 2:
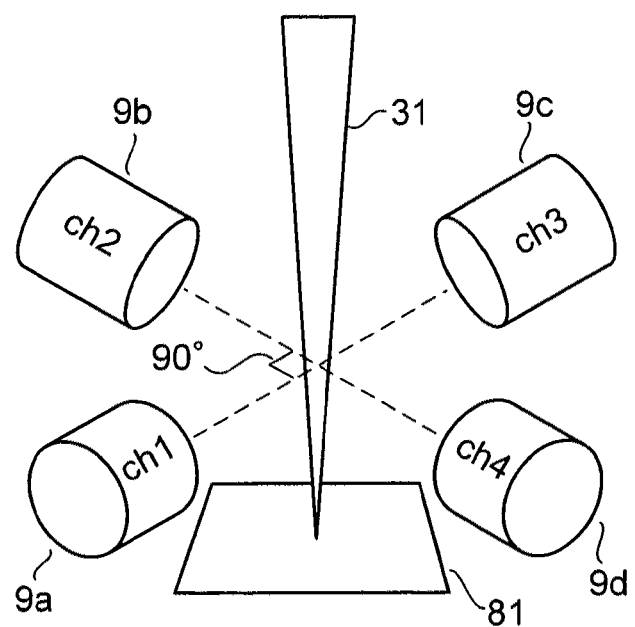
FIG. 2 is a schematic view showing an arrangement of electron detectors of the defect review apparatus of FIG. 1.

FIG. 1 is a block diagram showing a defect review apparatus according to an embodiment. FIG. 2 is a schematic view showing an arrangement of electron detectors of the defect review apparatus according to the embodiment.

As shown in FIG. 1, a defect review apparatus 100 of this embodiment are roughly divided into: a chamber 2 in which a sample is housed; an electron scanning part 1 which irradiates the sample with an electron beam; and a controller 10 which controls the electron scanning part 1 and a stage 7 in the chamber 2, and which performs processing of measured data.

The electron scanning part 1 has an electron gun 3 which emits an electron beam 31. The electron beam 31 is converged by a condensing lens 4, and is positioned by a deflection coil 5. Thereafter, the electron beam 31 is focused by an objective lens 6, and a surface of the sample is irradiated with the electron beam 31.

In addition, the electron scanning part 1 is provided with four electron detectors 9a to 9b for detecting electrons emitted from the surface of the sample.

As shown in FIG. 2, the first to fourth electron detectors 9a to 9d are arranged symmetrically around the optical axis of the electron beam 31 with 90° intervals in a view from the irradiation direction of the electron beam 31. Here, it is supposed that the electron detectors 9a to 9d are arranged in directions along the diagonal lines of a rectangular observation region 81. The electron detectors 9a to 9d are formed of a scintillator or the like, and capture secondary electrons and reflection electrons which are generated by irradiating a sample 8 with the electron beam 31. Then, the electron detectors 9a to 9d output electron amounts at their installed positions as signals ch1 to ch4, respectively.

As shown in FIG. 1, the chamber 2 is provided with the stage 7 having supporting bodies 7a on its top portion. The stage 7 holds the sample 8 such as a wafer or a photomask via the supporting bodies 7a, and can move the sample 8 by using an unillustrated driving mechanism.

The controller 10 includes a defect coordinate processing unit 14 and a design data processing unit 15. The defect coordinate processing unit 14 sets the region (observation region) 81 (see FIG. 2) to be observed on the surface of the sample 8. The design data processing unit 15 extracts part of design data corresponding to the observation region 81. The design data is data which indicates the pattern of a photomask or a wafer being the sample, and is used as a reference pattern shape without a defect in a case of distinguishing the pattern shape of the observation region 81, detecting a defect in the observation region 81, and the like.

In addition, the controller 10 includes: a signal processing unit 11 which generates image data (SEM image) by processing the signals from the electron detectors 9a to 9d; a defect inspection unit 12 and a comparison inspection unit which detect a defect on the basis of the image data generated by the signal processing unit 11; and a defect (unevenness) measuring unit 16 which measures the protrusion or depression defect and the height of the defect.

Figure 3:
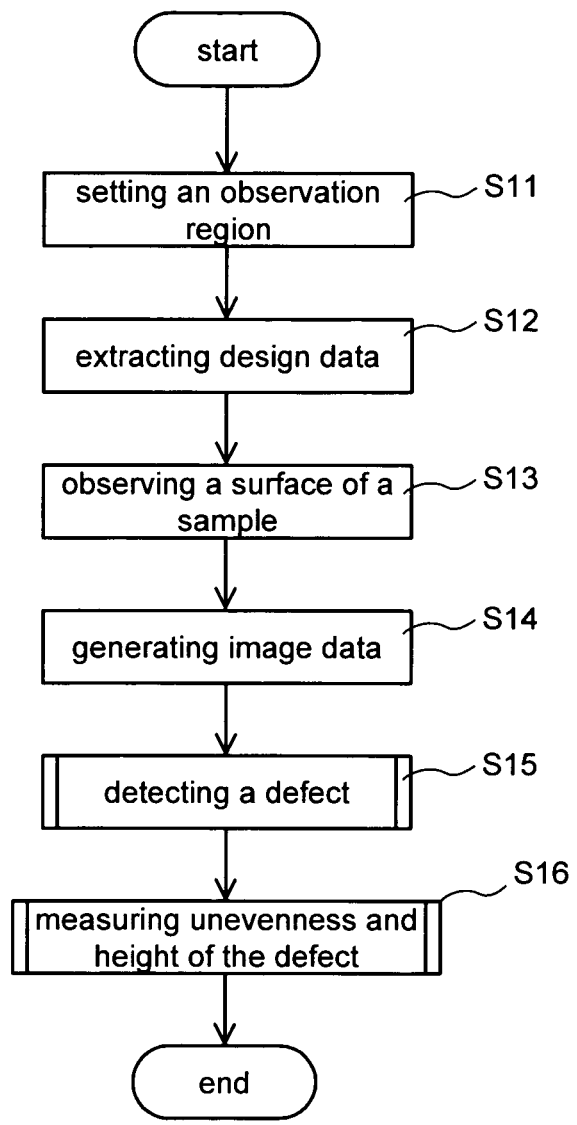
FIG. 3 is a flowchart showing a defect review method using the defect review apparatus according to the embodiment.

A defect review method using the defect review apparatus 100 will be described below. FIG. 3 is a flowchart showing the defect review method using the defect review apparatus 100.

Firstly, as shown in step S11 of FIG. 3, the defect coordinate processing unit 14 of the controller sets the rectangular observation region 81 on the surface of the sample 8 on the basis of defect coordinate data. Note that, the defect coordinate data is coordinate data which indicates the defect position detected by an optical inspection apparatus or the like, and is inputted into the defect coordinate processing unit 14 through a communication line or the like.

Next, in step S12, the design data processing unit 15 of the controller 10 extracts the design data of the observation region 81 set by the defect coordinate processing unit 14, and stores the thus extracted design data in a storage unit (not shown).

Subsequently, in step S13, observation of the sample 8 is performed by driving the electron scanning part 1 and the stage 7 under the control of the controller 10. Here, the controller 10 outputs a control signal to the stage 7, and performs the positioning of the sample 8. Thereafter, the controller 10 outputs a control signal to the electron scanning part 1, and the observation region 81 of the sample 8 is irradiated with the electron beam 31 and the electron beam 31 is scanned over the observation region 81. At this time, the electrons emitted from the surface of the sample 8 are captured by the electron detectors 9a to 9d. The electron detectors 9a to 9d send signals ch1 to ch4 to the signal processing unit 11 indicating the amounts of electrons detected.

Thereafter, in step S14, the signal processing unit 11 of the controller 10 converts the signals ch1 to ch4 sent from the electron detectors 9a to 9d into digital signals with an AD converter, and generates image data (SEM image) on the basis of the digital signals.

Figure 4:
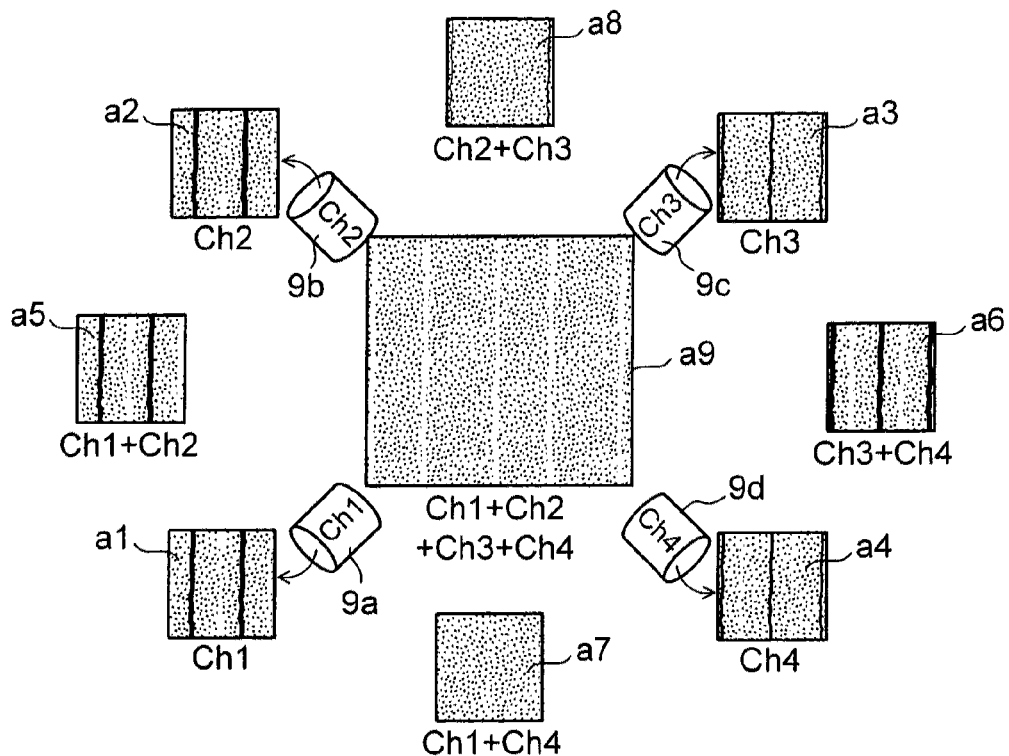
FIG. 4 is a schematic view showing an example of image data generated by a signal processing unit.
Figure 5:
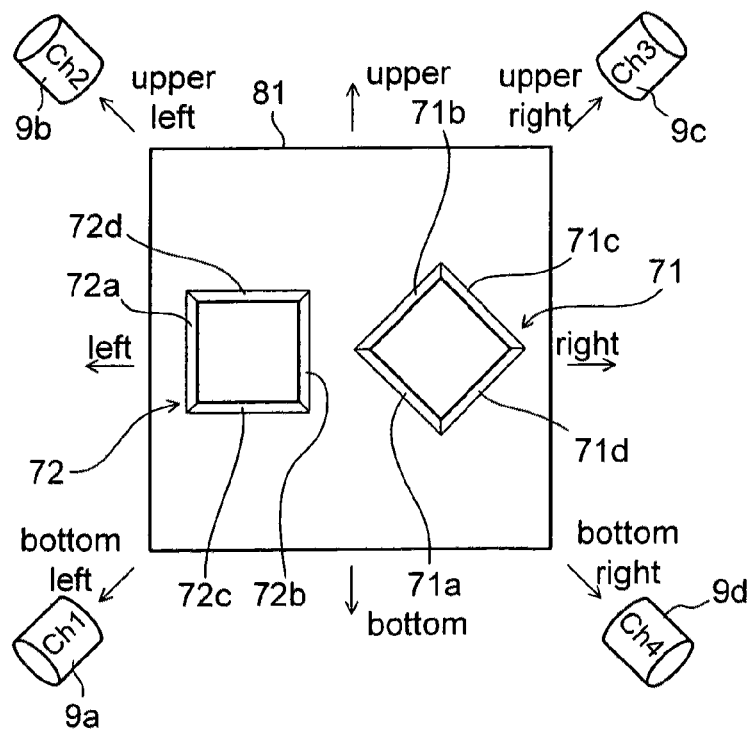
FIG. 5 is a plan view showing an example of patterns on a surface of the sample.

FIG. 4 is a schematic view showing an example of the image data generated by the signal processing unit 11. FIG. 5 is a plan view showing an example of patterns on a surface of a sample.

As shown in FIG. 4, the signal processing unit 11 generates a lower left image a1, an upper left image a2, an upper right image a3, and a lower right image a4 on the basis of the signals ch1 to ch4, respectively. The lower left image a1, the upper left image a2, the upper right image a3, and the lower right image a4 are SEM images of the observation region 81 taken from lower left, upper left, upper right, and lower right, respectively.

In addition, the signal processing unit 11 adds the signals of every two of the adjacent electron detectors to each other, and generates a left image a5, a right image a6, a lower image a7, and an upper image a8 respectively corresponding to SEM images of the observation region 81 taken in directions in the middle of every two of the adjacent electron detectors 9a to 9d (left, right, lower, and upper).

Moreover, the signal processing unit 11 adds all of the signals ch1 to ch4, and generates an all-signal-added image a9. The all-signal-added image a9 is an image similar to a secondary electron image obtained by a conventional scanning electron microscope, and edges facing all directions are displayed in substantially same high brightness. Thus, the all-signal-added image a9 is used for measuring the plane surface shape of the defect and the like.

In the images a1 to a8 generated by the signal processing unit 11, edges (inclined surfaces) respectively facing thereto are emphatically displayed. FIG. 5 is a view showing an example of protruding patterns on the surface of the sample 8. FIG. 5 shows a protruding pattern 71 which has edges 71a to 71d respectively facing lower left, upper left, upper right, and lower right, and shows a protruding pattern 72 which has edges 72a to 72d respectively facing left, right, lower, and upper.

When the sample shown in FIG. 5 is observed, the edge 71a facing lower left is displayed with the highest brightness in the lower left image a1, and the edge 71b facing upper left is displayed with the highest brightness in the upper left image a2. Furthermore, the edges 71c and 71d are displayed with the highest brightness in the upper right image a3 and the lower right image a4, respectively. Moreover, the edges 72a, 72b, 72c, and 72d are displayed with the highest brightness in the left image a5, the right image a6, the lower image a7, and the upper image a8, respectively.

The image data thus generated by the signal processing unit 11 is stored in the storage unit (not illustrated).

Thereafter, in step S15 of FIG. 3, the defect inspection unit 12 or the comparison inspection unit 13 performs defect detection. In step S16, the defect measuring unit 16 measures the protrusion or depression defect and the height of the defect.

The defect detection method in step S15 and the method of measuring the protrusion or depression defect and the height of the defect in step S16 will be described in further detail below.

Figure 6:
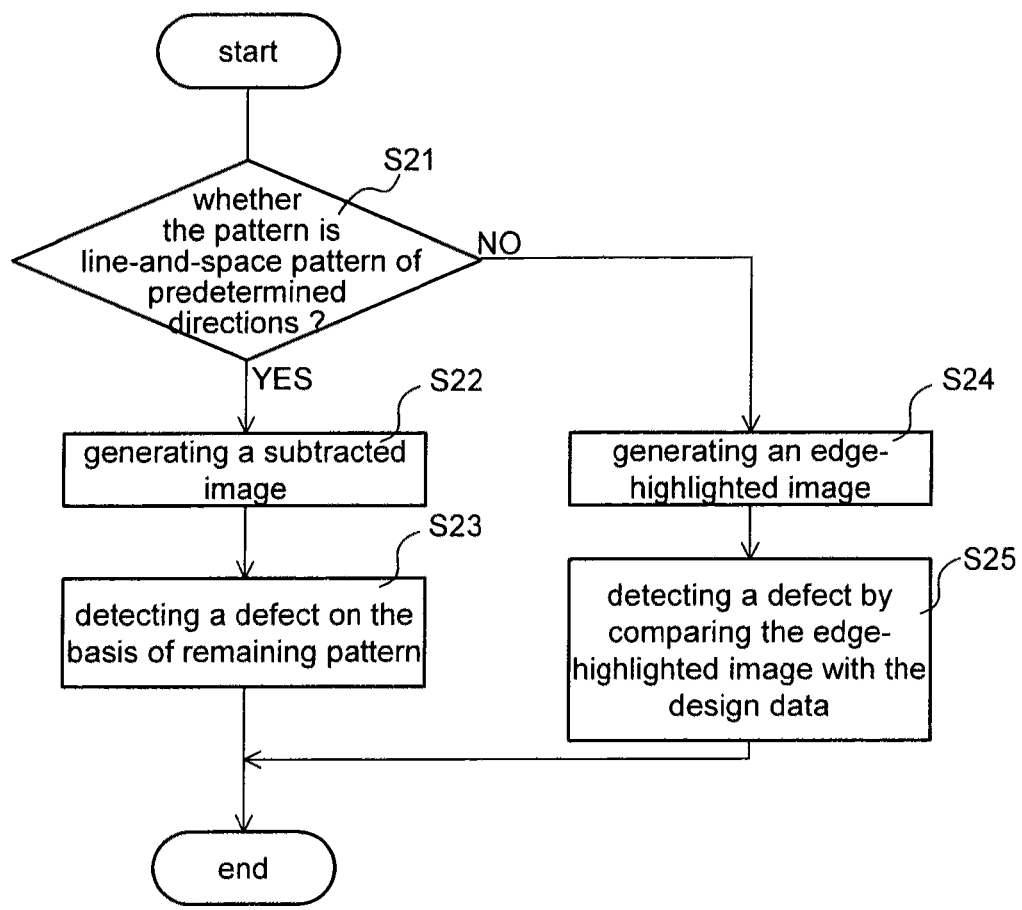
FIG. 6 is a flowchart showing a defect detection method performed by the defect review apparatus according to the embodiment.
Figure 7:
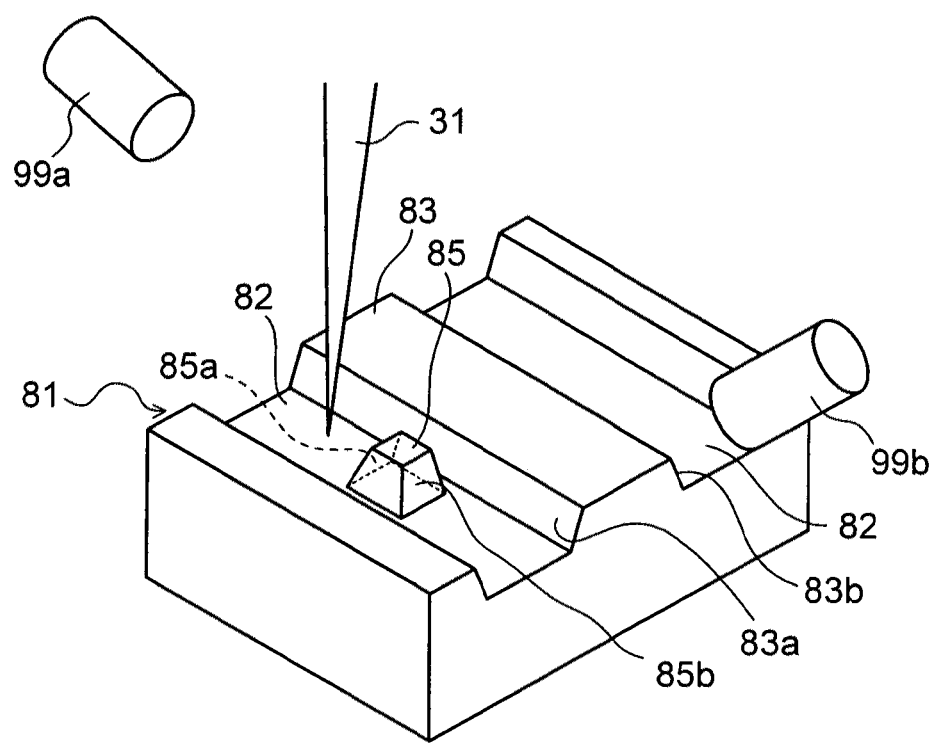
FIG. 7 is a schematic view for explaining a principal of the defect detection on a line-and-space pattern which is performed by the defect review apparatus according to the embodiment.
Figure 8A:
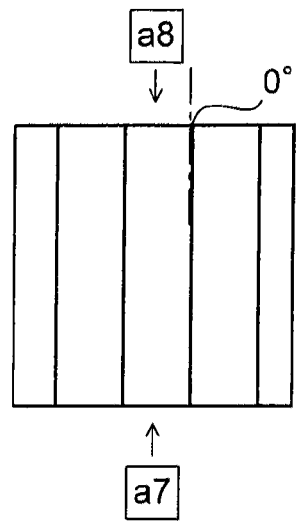
FIGS. 8A to 8C are schematic views for explaining a method of generating a subtract image in accordance with the direction of the line-and-space pattern.
Figure 8B:
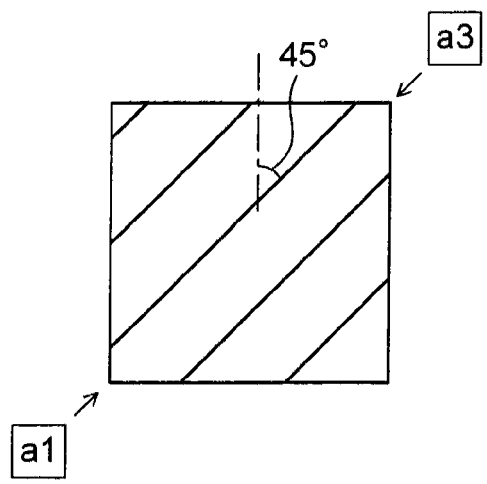
Figure 8C:
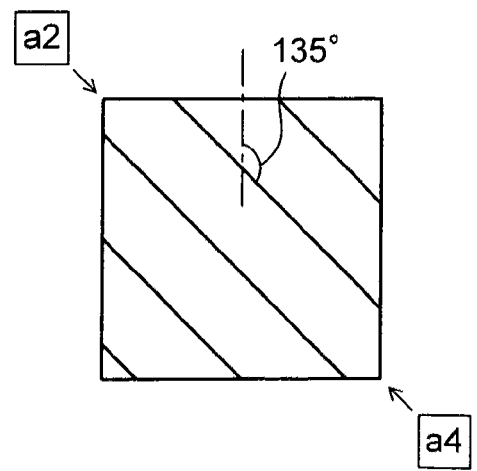

FIG. 6 is a flowchart showing the defect detection method performed by the defect review apparatus 100. FIG. 7 is a schematic view for explaining a principal of the defect detection on a line-and-space pattern which is performed by the defect review apparatus 100. FIGS. 8A to 8C are schematic views for explaining a method of generating a subtract image in accordance with the direction of the line-and-space pattern.

As shown in FIG. 6, firstly in step S21, the controller 10 evaluates the design data of the observation region 81, and determines whether the pattern of the observation region 81 is any one of a horizontal line-and-space pattern, a vertical line-and-space pattern, and a line-and-space pattern inclined at 45° or 135°. If the pattern in the observation region 81 is any one of the line-and-space patterns noted above (YES), the processing proceeds to step S22, and the defect detection by the defect inspection unit 12 is performed.

In step S22, the defect inspection unit 12 acquires, from the storage unit, two pieces of image data respectively obtained from two directions which are parallel to the extending direction of the line pattern, and which face each other with the optical axis of the electron beam 31 in between. The defect inspection unit 12 then takes the subtract between the two pieces of image data to generate a subtract image.

For example, as shown in FIG. 7, when the pattern of the observation region 81 is a horizontal line-and-space pattern, the defect inspection unit 12 acquires the left image a5 and the right image a6 from the storage unit, and takes the subtract between these images. Note that, in FIG. 7, reference numerals 99a and 99b show virtual positions of the electron detectors corresponding to the left image a5 and the right image a6, respectively.

As shown in FIG. 7, the line pattern 83 has edges 83a and 83b, and the directions (normal directions) to which these edges 83a and 83b face are directions between the electron detector 99a and the electron detector 99b. Thus, these edges 83a and 83b are displayed in approximately the same brightness in the left image a5 and the right image a6. Moreover, the direction to which the top surface of the line pattern 83 and spaces 82 face is a direction in the middle of the electron detector 99a and the electron detector 99b. Thus, these portions are also displayed in approximately the same brightness in the left image a5 and the right image a6. Accordingly, when the subtract between the left image a5 and the right image a6 is taken, the edges 83a and 83b, the line patterns 83, and the spaces 82 of the left image a5 and the right image a6 are canceled out, and the image of the line-and-space pattern is eliminated.

In the example of FIG. 7, a defect 85 has an edge 85a facing the electron detector 99a and an edge 85b facing the electron detector 99b. In this case, the brightness of the edge 85a is higher than the brightness of the edge 85b in the left image a5. Moreover, the brightness of the edge 85b is higher than the brightness of the edge 85a in the right image a6. Accordingly, when the subtract between the left image a5 and the right image a6 is taken, the edges 85a and the 85b of the defect 85 remain because they are not canceled out.

As described above, by taking the subtract between the left image a5 and the right image a6, a subtract image is obtained in which the line-and-space pattern is eliminated and only the defect 85 is shown.

Note that, when the line-and-space pattern is vertical) (0°) as shown in FIG. 8A, the subtract image with only the defect remaining can be obtained by taking the subtract between the lower image a7 and the upper image a8. Moreover, when the line-and-space pattern is a one inclined at 45° as shown in FIG. 8B, the subtract image can be obtained by taking the subtract between the lower left image a1 and the upper right image a3. When the line-and-space pattern is a one inclined at 135° as shown in FIG. 8C, the subtract image can be obtained by taking the subtract between the upper left image a2 and the lower right image a4.

Thereafter, in step S23 of FIG. 6, the defect inspection unit 12 detects the defect on the basis of the subtract image obtained in step S22. In this case, the defect detection can be performed speedily, for example, by performing a process of extracting edges from the subtract image.

If the pattern in the observation region 81 is judged not to be any one of the horizontal line-and-space pattern, the vertical line-and-space pattern, and the line-and-space pattern inclined at 45° or 135° (NO) in step S21, the processing proceeds to step S24, and the defect detection by the comparison inspection unit 13 is performed.

In step S24, the comparison inspection unit 13 generates an edge-emphasized image in which edges extending in oblique directions are emphasized. Here, the subtract between the lower left image a1 and the upper right image a3 is taken to generate an image in which edges extending in a diagonal direction from the upper left to the lower right are emphasized. Moreover, the subtract between the upper left image a2 and the lower right image a4 is taken to generate an image in which edges extending in a diagonal direction from the lower left to the upper right are emphasized. Then, the image obtained from the subtract between the lower left image a1 and the upper right image a3 and the image obtained from the subtract between the upper left image a2 and the lower right image a4 are added to each other to generate the edge-emphasized image in which edges extending in oblique directions are emphasized.

Next, in step S25, the comparison inspection unit 13 compares the edge-emphasized image generated in step S24 and the design data, and detects a defect on the basis of subtract of the edge positions between the edge-emphasized image and the design data. Such detection processing performed by the comparison inspection unit 13 allows detection of a defect in any pattern other than the line-and-space pattern in prescribed directions.

Next, the method of measuring the protrusion or depression defect and the height (or depth) of the defect detected by the above method will be described. FIGS. 9A to 9E are schematic views for explaining a principle of the measurement of the protrusion or depression defect and the height of the defect.

When the electron beam 31 is scanned over the sample surface with protrusion or depression defect, the intensity of the signal from the electron detector generally varies in accordance with a direction to which a portion of the sample surface irradiated with the electron beam 31 is oriented. Specifically, the closer the direction (normal direction) to which the portion of the sample surface irradiated with the electron beam 31 oriented is to the direction in which of the electron detector is installed, the larger it becomes the intensity of the signal from the electron detector.

Figure 9A:
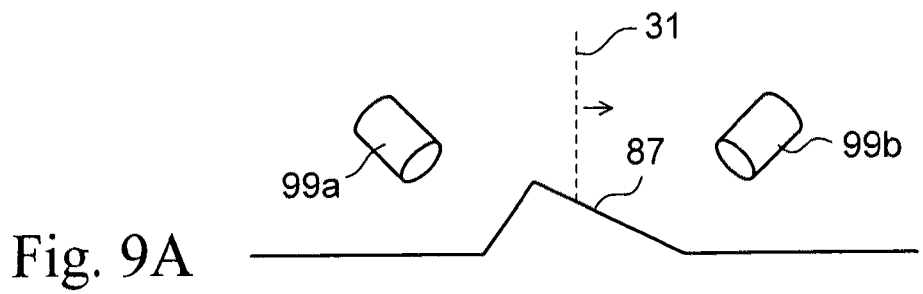
FIGS. 9A to 9E are schematic views for explaining a principle of measurement of the protrusion or depression defect and the height of the defect in the defect review apparatus according to the embodiment.
Figure 9B:
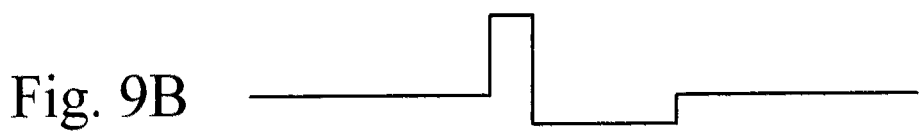
Figure 9C:

Accordingly, when the electron beam 31 is scanned over the sample surface having a cross section as shown in FIG. 9A and the electrons emitted from the sample surface are detected by the two electron detectors 99a and 99b which are disposed facing each other with the electron beam 31 in between, a signal waveform of FIG. 9B is obtained from the electron detector 99a and waveform of FIG. 9C is obtained from the electron detector 99b.

As shown in FIG. 9B, the signal waveform of the electron detector 99a is high at a portion corresponding to a left inclined surface of the defect 87 facing the electron detector 99a, and is low at a portion corresponding to a right inclined surface of the defect 87 facing away from the electron detector 99a. In other words, the signal waveform of FIG. 9B reflects the direction (normal direction) to which the sample surface faces with respect to the direction in which the electron detector 99a is installed.

As shown in FIG. 9C, the signal waveform of the electron detector 99b is low at the portion corresponding to the left inclined surface of the defect 87 facing away from the electron detector 99b, and is high at the portion corresponding to the right inclined surface of the defect 87 facing the electron detector 99b. In other words, the signal waveform of FIG. 9C reflects the direction (normal direction) to which the sample surface faces with respect to the direction in which the electron detector 99b is installed.

Figure 9D:
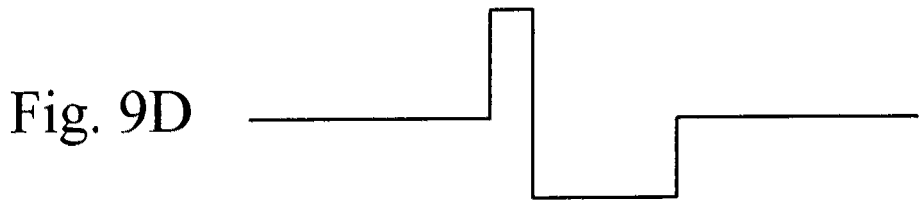

A subtract profile of the sample surface as shown in FIG. 9D is obtained by taking the subtract between the signal waveforms of FIGS. 9B and 9C. In this subtract profile, signals from a flat portion of the sample surface are eliminated. As described above, the signal waveforms of FIGS. 9B and 9C reflect the directions to which the surfaces of the defect 87 face with respect to the electron detector 99a and the electron detector 99b, respectively. Moreover, the subtract profile obtained by taking the subtract between FIGS. 9B and 9C reflects the magnitude of inclination of each surface of the defect 87 with respect to the flat portion of the sample surface.

Figure 9E:

Thus, by integrating the waveform of FIG. 9D, an integration profile as shown in FIG. 9E which reflects the shape of the defect 87 of the sample surface is obtained. It is checked whether the integration profile reflecting the defect 87 is a depression or a protrusion, and thereby it can be judged whether the defect 87 is a protrusion protruding from the sample surface or a depression formed by hollowing of the sample surface.

Moreover, in a case of a pattern whose height is known in advance (hereinafter, referred to as reference pattern), the actual height of the defect 87 can be obtained by obtaining the integration profile in a manner similar to the above described process, and then by comparing the height of the integration profile of the reference pattern with the height of the integration profile reflecting the defect 87.

Figure 10:
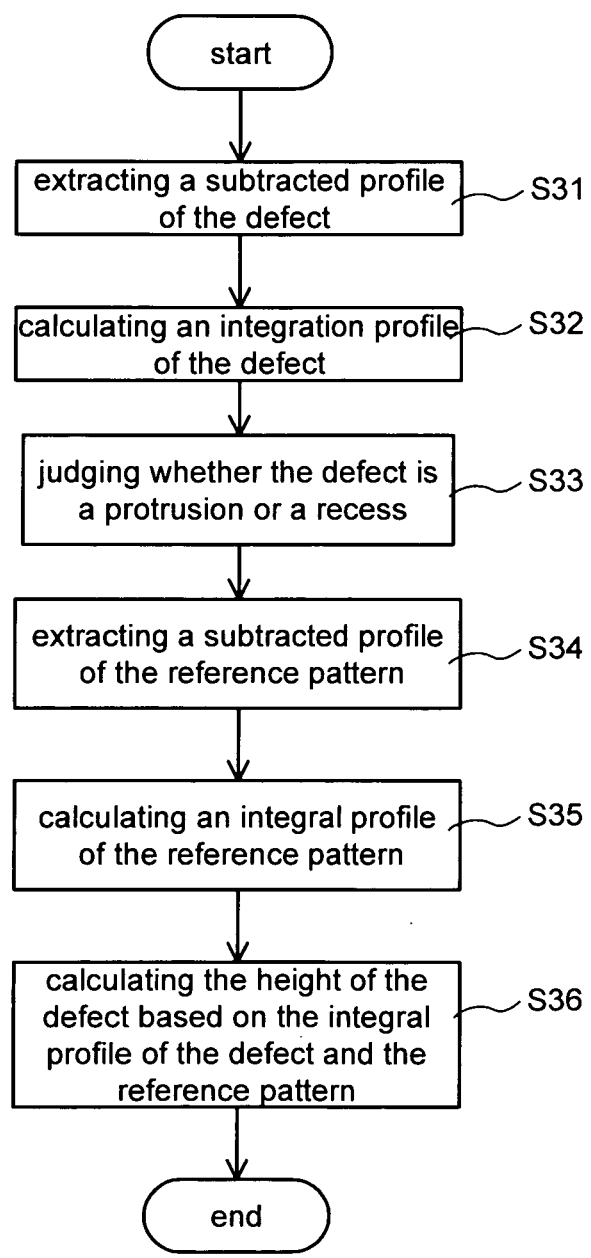
FIG. 10 is a flowchart showing a method of measuring the protrusion or depression defect and the height of the defect using the defect review apparatus according to the embodiment.

In this embodiment, the height of the defect is detected in the following method. FIG. 10 is a flowchart showing the method of measuring the protrusion or depression defect and the height of the defect using the defect review apparatus 100. FIGS. 11A to 11E are schematic views for explaining the method of measuring the protrusion or depression defect and the height of the defect. Note that, in FIG. 11, reference numeral 31 denotes the electron beam, reference numeral 83 denotes the line pattern, and reference numeral 85 denotes the defect.

Figure 11A:
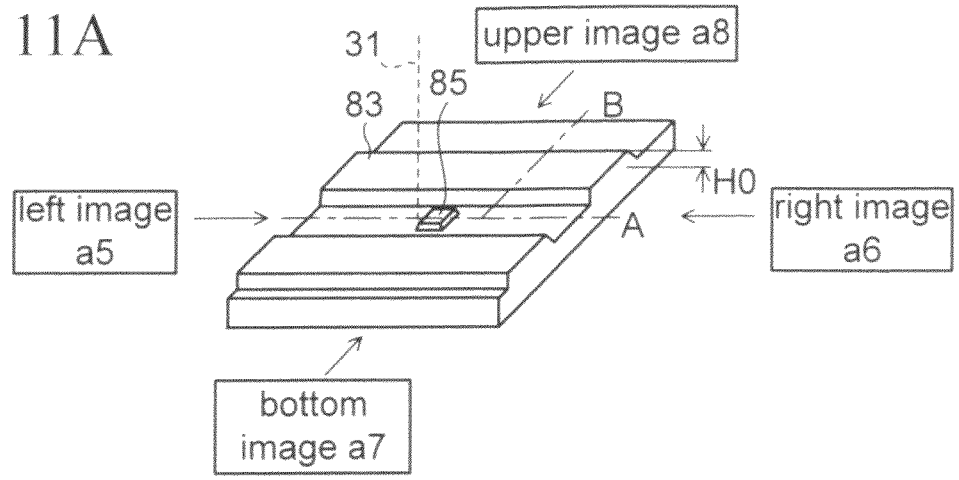
FIGS. 11A to 11E are schematic views for explaining the method of measuring the protrusion or depression defect and the height of the defect according to the embodiment.
Figure 11B:
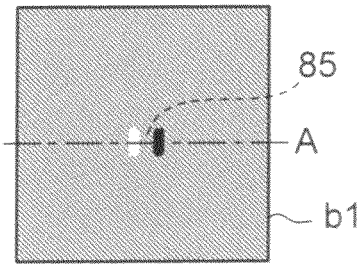
Figure 11C:
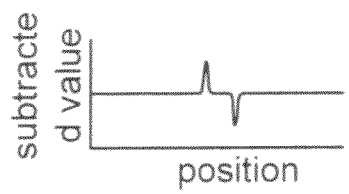

Firstly, as shown in step S31 of FIG. 10, the defect (unevenness) measuring unit 16 of the controller 10 acquires the subtract profile of the defect. For example, as shown in FIG. 11A, the defect measuring unit 16 extracts two pieces of image data (left image a5 and right image a6) from respective two directions facing each other with the electron beam 31 in between. Then, as shown in FIG. 11B, the subtract between the two pieces of image data is taken to obtain the subtract image b1. Next, a line A is set in the subtract image b1, the line A being parallel to the direction to the left image a5 and the right image a6 (right-left direction) and passing through the defect 85. The subtract value of the portion along the line A is then extracted. Thus, the subtract profile of the defect is obtained as shown in FIG. 11C.

Figure 11D:
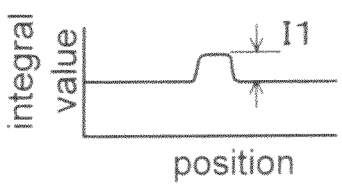

Thereafter, in step S32 of FIG. 10, the defect measuring unit 16 integrates the subtract profile obtained in step S31, and calculates the integration profile reflecting the defect. Specifically, the defect measuring unit 16 integrates the subtract profile of FIG. 11C, and calculates the integration profile as shown in FIG. 11D. This integration profile reflects the distribution of the height of the defect in a cross section along the line A.

Next, in step S33, the defect measuring unit 16 checks whether the integration profile reflecting the defect is a protrusion or a depression, and thereby judges whether the defect is a protrusion protruding from the sample surface or a depression formed by hollowing of the sample surface. For example, the defect 85 of FIG. 11A is judged as a protrusion on the basis of the integration profile of FIG. 11D.

Subsequently, in step S34, the defect measuring unit 16 obtains the subtract profile of the reference pattern. For example, when there is the line pattern 83 whose height is known in the sample shown in FIG. 11A, the line pattern 83 is used as the reference pattern. In this case, a subtract image is generated by taking the subtract between two pieces of image data (lower image a7 and upper image a8) respectively taken in directions orthogonal to the line pattern 83. Then, as shown in FIG. 11A, a line B orthogonal to the line pattern 83 is set, and the subtract value of a portion along the line B is extracted from the subtract image. Thus, the subtract profile of the reference pattern is obtained.

Figure 11E:
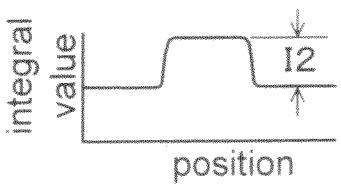

Next, in step S35, the defect measuring unit 16 integrates the subtract profile of the reference pattern obtained in step S34, and obtains the integration profile of the reference pattern (see FIG. 11E).

Thereafter, in step S36, the peak value of the integration profile reflecting the defect 85 and the peak value of the integration profile of the reference pattern (line pattern 83) is compared, and the height H of the defect is thereby calculated. For example, as shown in FIGS. 11D and 11E, when the peak value of the integration profile reflecting the defect is I1 and the peak value of the integration profile of the reference pattern is I2, the ratio of the peak value of the integration profile reflecting the defect to the peak value of the integration profile of the reference pattern is I1/I2. As shown in FIG. 11A, when the actual height of the reference pattern (line pattern 83) is H0, the height H (=I1/I2×H0) of the defect 85 is obtained by multiplying the I1/I2, which is the ratio of the integration profile reflecting the defect to the integration profile of the reference pattern, with the height H0 of the reference pattern.

As described above, according to this embodiment, the defect can be detected speedily on the basis of the subtract image when the observation region 81 is a line-and-space pattern. Moreover, according to this embodiment, the defect on a horizontal line-and-space pattern, a vertical line-and-space pattern, and a line-and-space pattern inclined at 45° or at 135° can be detected without rotating the sample. Thus, the defect detection processing can be performed even more speedily.

Furthermore, whether the defect is a protrusion or a depression can be judged on the basis of the integration profile reflecting the defect. In addition, the height of the defect can be detected by comparing the integration profile reflecting the defect with the integration profile of the reference pattern.

Example 1

A sample of Example 1 is a one in which multiple line patterns each made of chrome (Cr) with a thickness of approximately 80 nm and a width of approximately 80 nm are formed on a glass substrate, and a space of approximately 80 nm is provided between each adjacent line patterns. Here, the line patterns extend in a horizontal direction within an observation region 81.

Figure 12A:
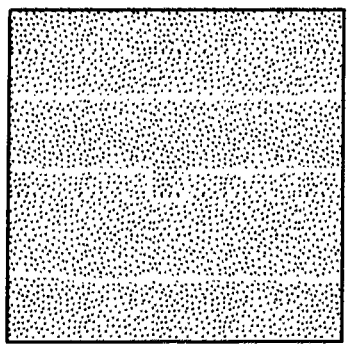
FIGS. 12A to 12D are views showing SEM images and a subtract image of a sample of Example 1.
Figure 12B:
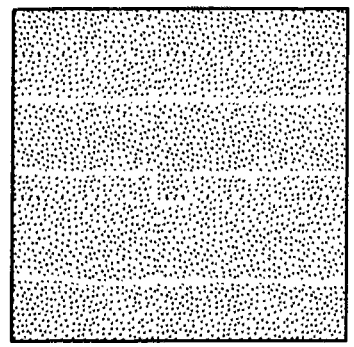
Figure 12C:
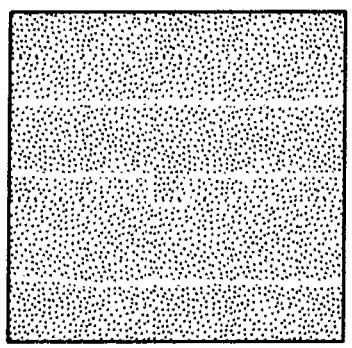
Figure 12D:
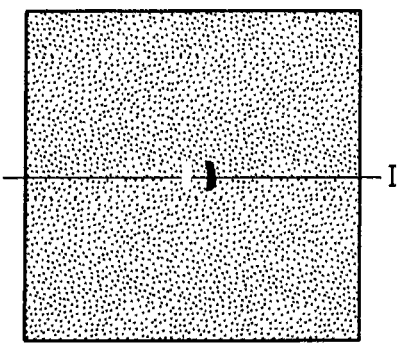

FIG. 12A shows a right image a6 of the sample of Example 1, FIG. 12B shows a left image a5 of the sample of Example 1, FIG. 12C shows an all-signal-added image a9 of the sample of Example 1, and FIG. 12D shows a subtract image obtained by taking the subtract between the right image a6 and the left image a5.

As shown in FIGS. 12A to 12C, a rectangular pattern appears in a center portion of the observation region 81. In a conventional case, it cannot be judged whether this rectangular pattern is a defect or not until pattern matching (comparison process) with design data or with an observation result of a normal pattern is performed.

However, as shown in FIG. 12D, in this example, the line-and-space pattern is eliminated by taking the subtract between the left image a5 and the right image a6, and thereby the subtract image in which only the defect appears can be obtained. Hence, the defect can be easily detected.

Figure 13A:
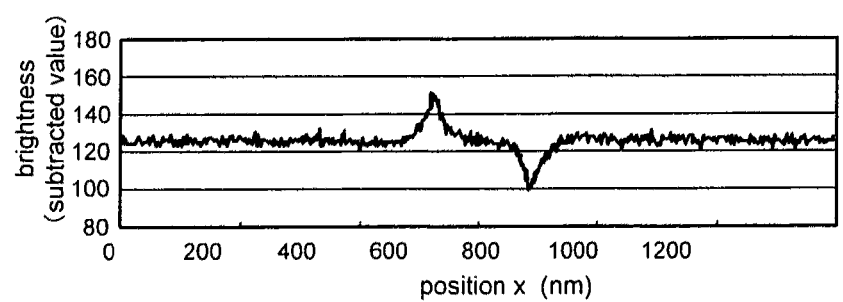
FIGS. 13A and 13B are graphs showing a subtract profile and an integration profile of a defect in Example 1, respectively.
Figure 13B:
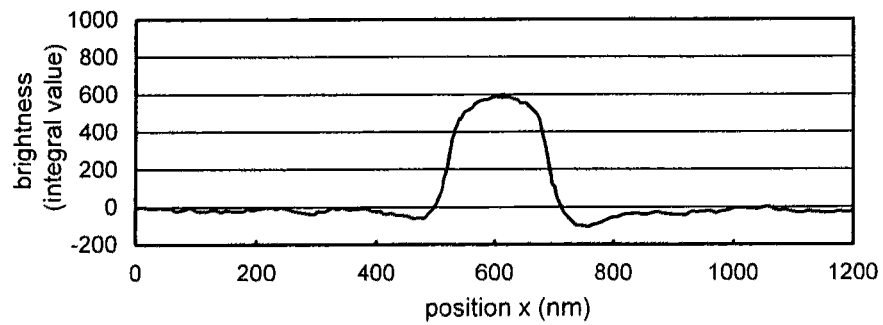

Next, results of obtaining the subtract profile and the integration profile of the detected defect are shown in FIGS. 13A and 13B. FIG. 13A is a graph showing the subtract profile at I-I line of FIG. 12D, and FIG. 13B is a graph showing the integration profile obtained by integrating the subtract profile of FIG. 13A.

As shown in FIG. 13B, since the integration profile of the defect is protruding upward, it is apparent that the defect is a protrusion. Moreover, the peak value of the integration profile of the defect was approximately 600 (brightness value).

Figure 14A:
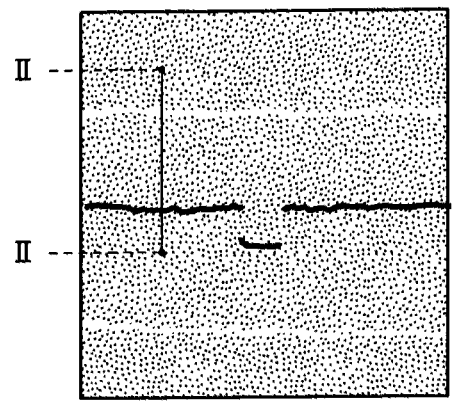
FIGS. 14A to 14C are views showing a subtract image, a subtract profile, and an integration profile of a reference pattern of Example 1, respectively.
Figure 14B:
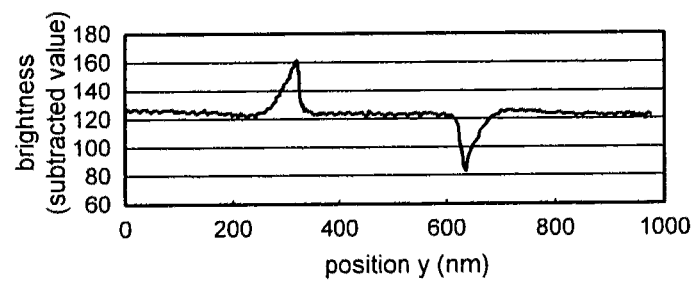
Figure 14C:
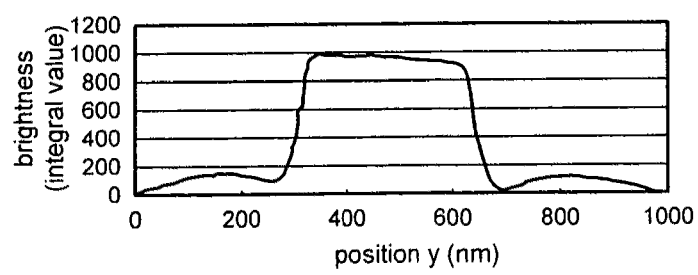

Next, a result of obtaining the height of the defect by calculating an integration profile of a reference pattern will be described. FIGS. 14A to 14C are views showing the subtract image, the subtract profile, and the integration profile of the sample of Example 1, respectively.

As shown in FIG. 14A, in Example 1, the line patterns were used as reference patterns, and the subtract image was obtained by taking the subtract between the upper image a8 and the lower image a7, which were images taken in directions orthogonal to the extending direction of the line patterns. Thereafter, a subtract value at a II-II line crossing the line pattern was extracted from the subtract image to obtain the subtract profile shown in FIG. 14B. Then, the integration profile of the reference pattern as shown in FIG. 14C was obtained by integrating the subtract profile of FIG. 14B.

As shown in FIG. 14C, the peak value of the integration profile of the reference pattern is approximately 1000 (brightness value). As noted above, it is known that the height of the reference pattern (line pattern) is 80 nm. Accordingly, the ratio of the peak value of the integration profile reflecting the defect to the peak value of the integration profile of the reference pattern is 600/1000. This ratio is multiplied with the height of the reference pattern, which is 80 nm, and thus it is obtained that the height of the defect is approximately 48 nm (=600/1000×80 nm).

Example 2

Example 2 will be described in which a detect review is performed on a sample having a depression-shaped defect.

Similar to the sample of Example 1, a sample of Example 2 is a one in which multiple line patterns each made of chrome (Cr) with a height of approximately 80 nm and a width of approximately 80 nm are formed on a glass substrate, and a space of approximately 80 nm is provided between each adjacent line patterns. The line patterns are arranged in a horizontal direction also in Example 2.

FIG. 15A is a view showing an all-signal-added image a9 of the sample of Example 2, and FIG. 15B is a view showing a subtract image between a left image a5 and a right image a6 of the sample of Example 2.

As shown in FIG. 15A, a rectangular pattern can be observed in a center portion of an observation region 81. Moreover, it can be determined that the rectangular pattern of FIG. 15A is a defect from the subtract image of FIG. 15B.

Next, the result of obtaining a subtract profile and an integration profile of the defect is shown in FIGS. 16A and 16B, respectively. FIG. 16A is a graph showing the subtract profile at a line of FIG. 15B, and FIG. 16B is a graph showing the integration profile of the defect obtained by integrating the subtract profile of FIG. 16A.

As shown in FIG. 16B, since the integration profile of the defect is depressioned, it is apparent that the defect is a depressioned pattern formed by a partial hollowing of the line and space pattern. Moreover, the peak value of the integration profile of the defect was approximately −280 (brightness value).

Figure 17A:
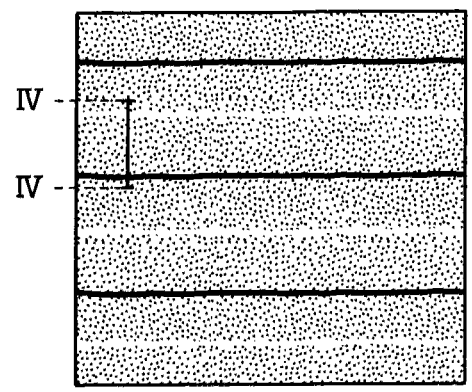
FIGS. 17A to 17C are views showing a subtract image, a subtract profile, and an integration profile of a reference pattern of Example 2, respectively.
Figure 17B:
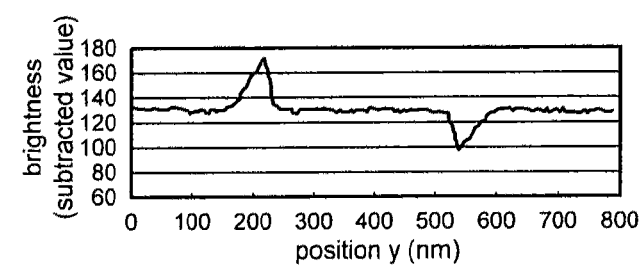

Thereafter, a subtract profile and an integration profile of a reference pattern (line pattern) were obtained. FIG. 17A is a view showing a subtract image obtained by taking the subtract between an upper image a8 and a lower image a7 of the sample of Example 2, FIG. 17B is a view showing a subtract profile at a IV-IV line of FIG. 17A, and FIG. 17C is a view showing the integration profile of the reference pattern obtained by integrating the subtract profile of FIG. 17B.

Figure 17C:
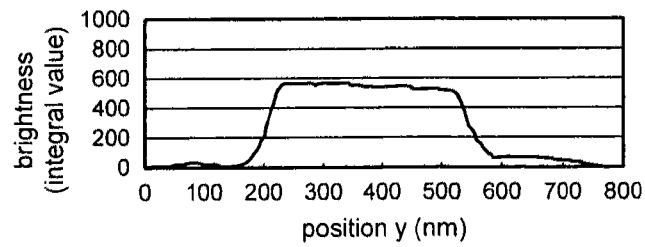

As shown in FIG. 17C, the peak value of the integration profile of the reference pattern is approximately 560 (brightness value). Moreover, as noted above, the height of the reference pattern is known to be 80 nm. Accordingly, the ratio of the peak value of the integration profile reflecting the defect to the peak value of the integration profile of the reference pattern is −280/560. This ratio is multiplied with the height of the reference pattern (80 nm), and thus the height (depth) of the defect of FIG. 15A is approximately −40 nm (=−280/560×80 nm).

Modifications of Embodiment

In the defect review apparatus 100 described above, four electron detectors are provided. However, the defect review apparatus 100 is not limited to this configuration, and the number of the electron detectors 9 may be any number which is two or more.

Figure 18:
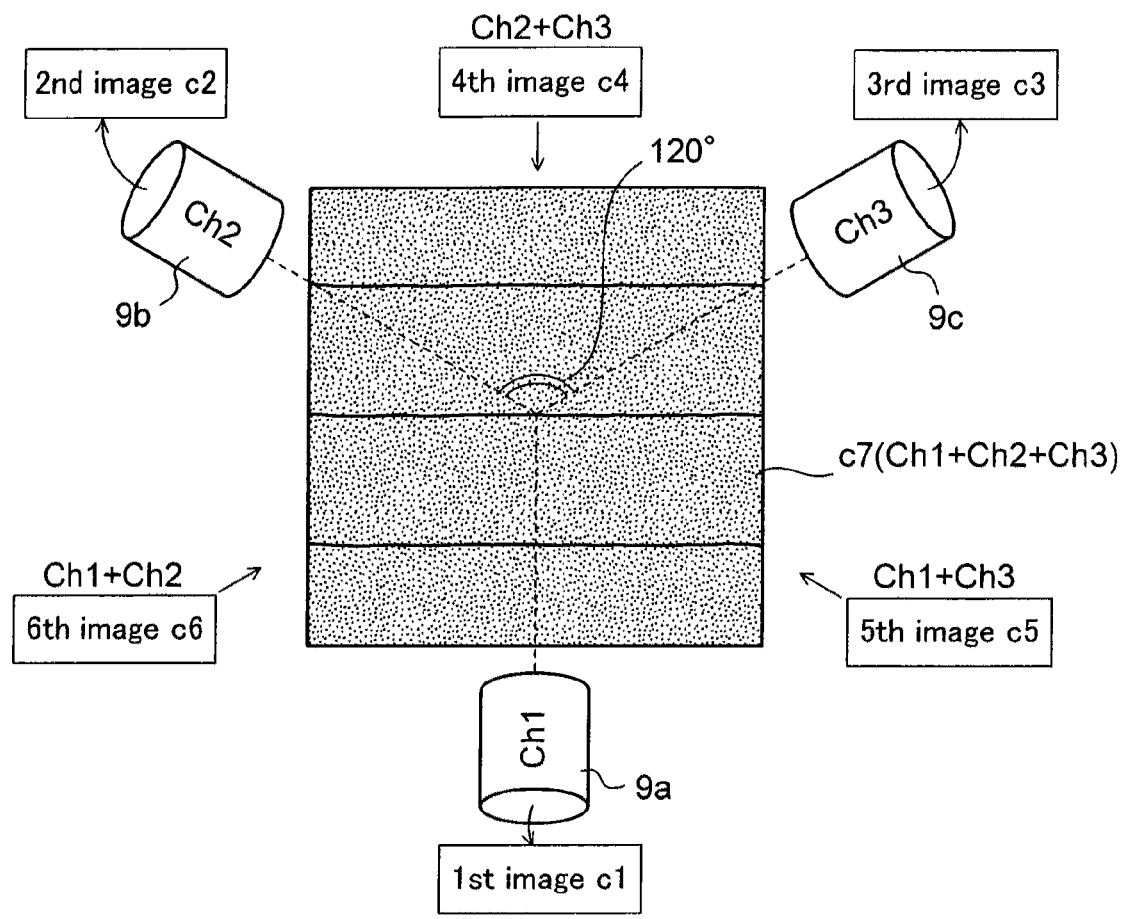
FIG. 18 is a schematic view showing an arrangement of electron detectors of a defect review apparatus according to a modification of the embodiment.

FIG. 18 is a schematic view showing an arrangement of electron detectors in a defect review apparatus 100 according to a modification of the embodiment, and shows a case of arranging three electron detectors.

As shown in FIG. 18, when three electron detectors are provided, first to third electron detectors 9a to 9c are arranged around the optical axis of an electron beam 31 with 120° intervals in a view from the irradiation direction of the electron beam 31.

Moreover, a signal processing unit 11 generates a first image c1, a second image c2, and a third image c3 on the basis of signals ch1 to ch3 sent from the electron detectors 9a to 9c, respectively, the images c1 to c3 being images of an observation region respectively taken in directions in which the electron detectors 9a to 9c are installed. In addition, the signal processing unit 11 generates a fourth image c4, a fifth image c5, and a sixth image c6 by adding the signals from the adjacent electron detectors, and also generates an all-signal-added image c7 by adding the signals ch1 to ch3. Note that, the fourth to sixth images c4, c5, and c6 correspond respectively to SEM images taken in directions in the middle of every two of the adjacent electron detectors 9a, 9b, and 9c.

Figure 19A:
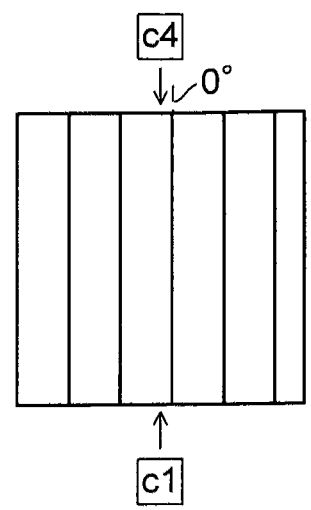
FIG. 19 is a schematic diagram for explaining a method of generating a subtract image in the modification shown in FIG. 18.
Figure 19B:
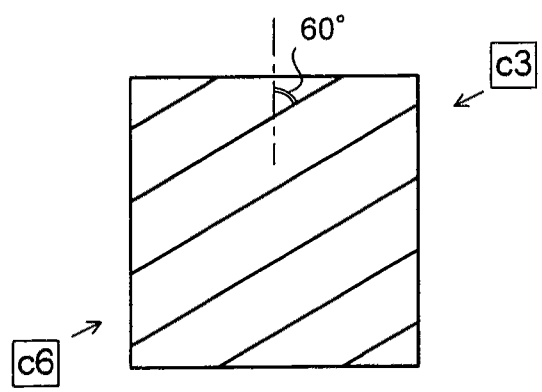
Figure 19C:
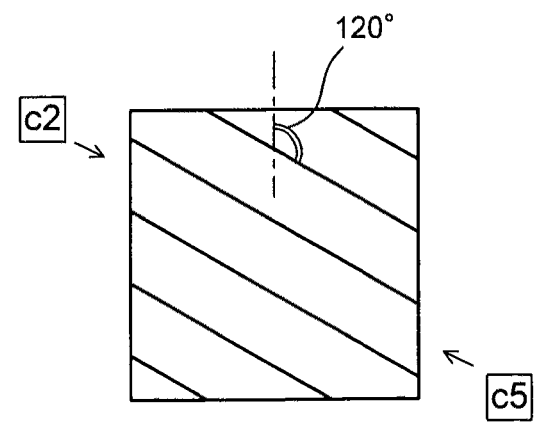

FIGS. 19A to 19C are schematic views for explaining a method of generating a differential image in the modification shown in FIG. 18.

In this modification, when there is a line-and-space pattern inclined at 60° or at 120°, a defect inspection unit 12 performs the defect detection.

In this case, as for a vertical (0°) line-and-space pattern as shown in FIG. 19A, a subtract image is generated in which the line-and-space pattern is canceled out by taking the subtract between the fourth image c4 and the first image c1. Thus, the defect is remained which can be easily detected based on this subtract image. Moreover, as for a line-and-space pattern inclined at 60° as shown in FIG. 19B, the defect is detected based on an subtract image obtained by taking the subtract between the sixth image c6 and the third image c3. Furthermore, as for a line-and-space pattern inclined at 120° as shown in FIG. 19C, the defect is detected based on an subtract image obtained by taking the subtract between the fifth image c5 and the second image c2.

Note that, the defect review apparatus 100 of this modification may be provided with two electron detectors. In this case, the electron detectors are arranged in a manner facing each other with the optical axis of the electron beam 31 in between, and the defect review apparatus 100 may be configured to detect a defect on a line-and-space pattern extending in any direction by providing a rotation mechanism on a stage 7.

Second Embodiment

In a second embodiment, descriptions are given of a defect detection method in a line pattern extending in any direction on the basis of a subtract image. Note that, a defect is detected by the defect review apparatus 100 shown in FIG. 1 also in this embodiment.

Figure 20:
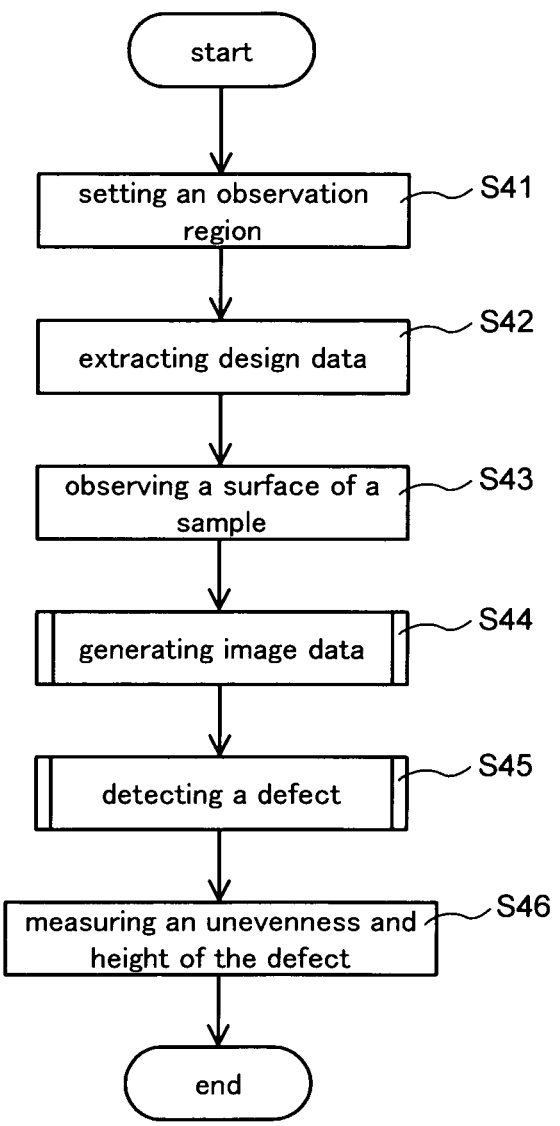
FIG. 20 is a flowchart showing a defect review method according a second embodiment.

FIG. 20 is a flowchart showing a defect review method according the second embodiment.

As shown in FIG. 20, the defect review apparatus 100 sets an observation region 81 in step S41. Thereafter, the processing proceeds to step S42 and the design data of the observation region 81 is extracted. Then, in step S43, observation of the sample surface is performed by irradiating the observation region 81 with an electron beam 31 and having the electron beam 31 scanned over the observation region 81. Note that, steps S41 to S43 described above are the same as steps S11 to S13 described with reference to FIG. 3.

Next, in step S44, a signal processing unit 11 of the defect review apparatus 100 generates images of the observation region 81 which are taken in a plurality of directions, on the basis of detection signals ch1 to ch4 sent from electron detectors 9a to 9d, respectively.

Figure 21:
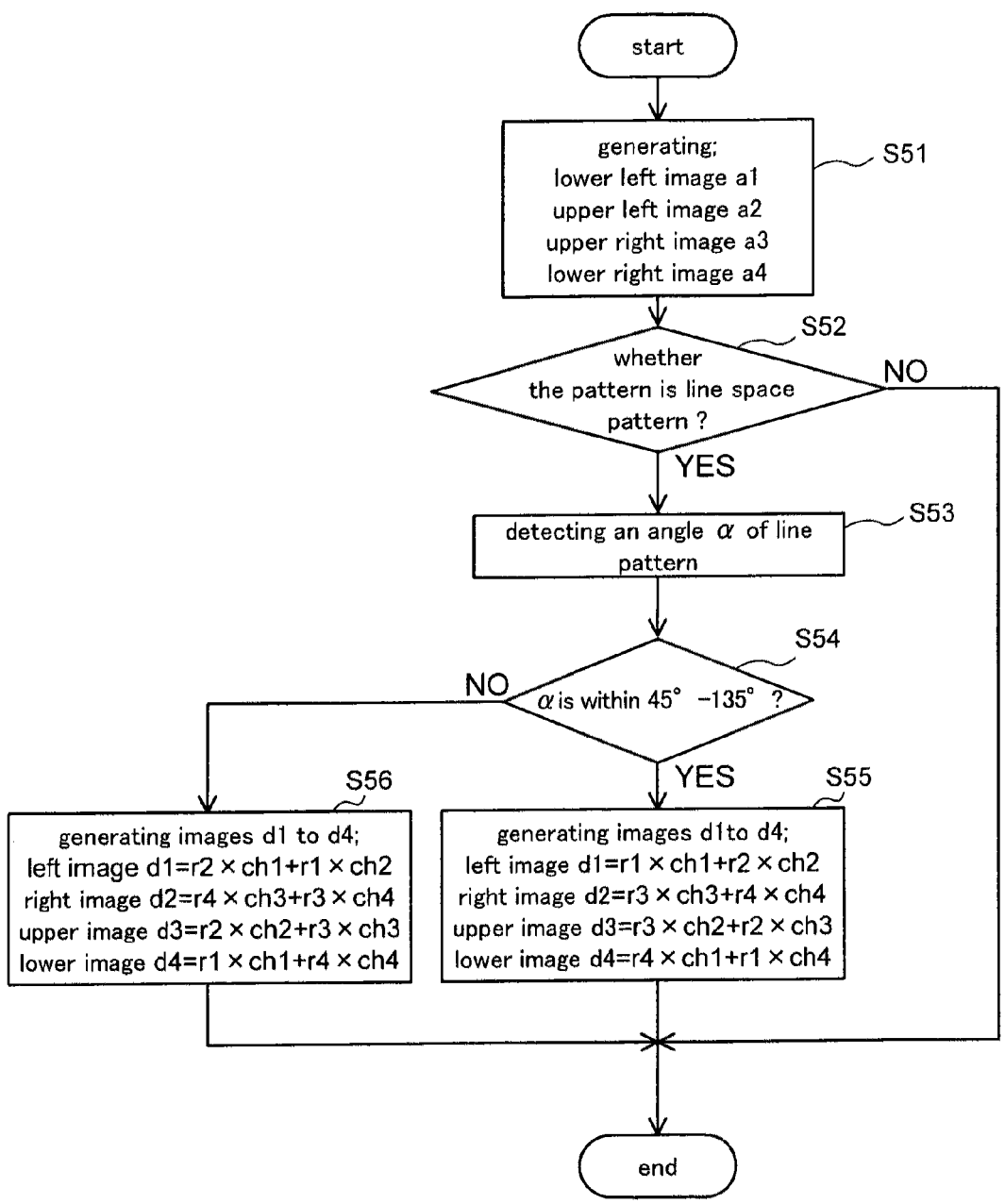
FIG. 21 is a flowchart showing a method of generating an image according to the second embodiment.

FIG. 21 is a flowchart showing a method of generating an image in step S44.

First, in step S51 of FIG. 21, the signal processing unit 11 generates a lower left image a1, an upper left image a2, an upper right image a3, and a lower right image a4 on the basis of the detection signals ch1 to ch4 sent from the electron detectors 9a to 9d, respectively. These images are SEM images of the observation region 81 taken from lower left, upper left, upper right, and lower right, respectively.

Next, in step S52, the signal processing unit 11 evaluates the design data and determines whether or not a pattern of the observation region 81 is a line-and-space pattern. When the signal processing unit 11 determines in step S52 that the pattern of the observation region 81 is a line-and-space pattern (YES), the processing proceeds to step S53. When the signal processing unit 11 determines that the pattern of the observation region 81 is not a line-and-space pattern (NO), generation of the image is terminated.

Next, in step S53, the signal processing unit 11 detects an angle α of a line pattern included in the line-and-space pattern on the basis of the design data.

Figure 22:
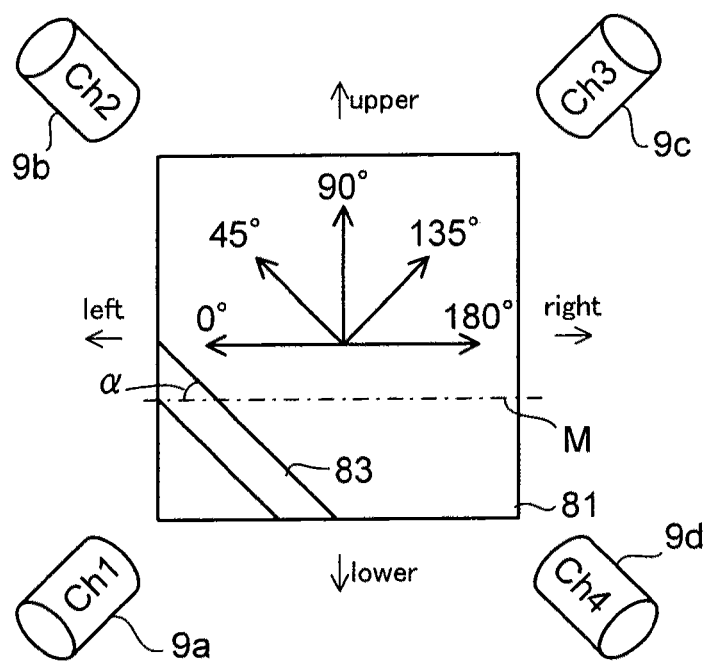
FIG. 22 is a view showing a definition of an angle of a line pattern in the second embodiment.

FIG. 22 is a view showing a definition of an angle of a line pattern in this embodiment In this embodiment, as shown in FIG. 22, an angle formed between a straight line M extending in a lateral direction and a direction in which a line pattern 83 extends is determined as the angle α of the line pattern. Moreover, a line pattern with an angle of 180° or more is considered to be the same as a line pattern with an angle equal to an angle obtained by subtracting 180° from the aforementioned angle. For example, a line pattern of 200° is considered the same as a line pattern of 20°.

Next, the processing proceeds to step S54 and the signal processing unit 11 judges whether or not the angle α of the line pattern is within a range of 45° to 135°. When the signal processing unit 11 judges in step S54 that the angle α of the line pattern is within a range of 45° to 135° (YES), the processing proceeds to step S55.

Figure 23A:
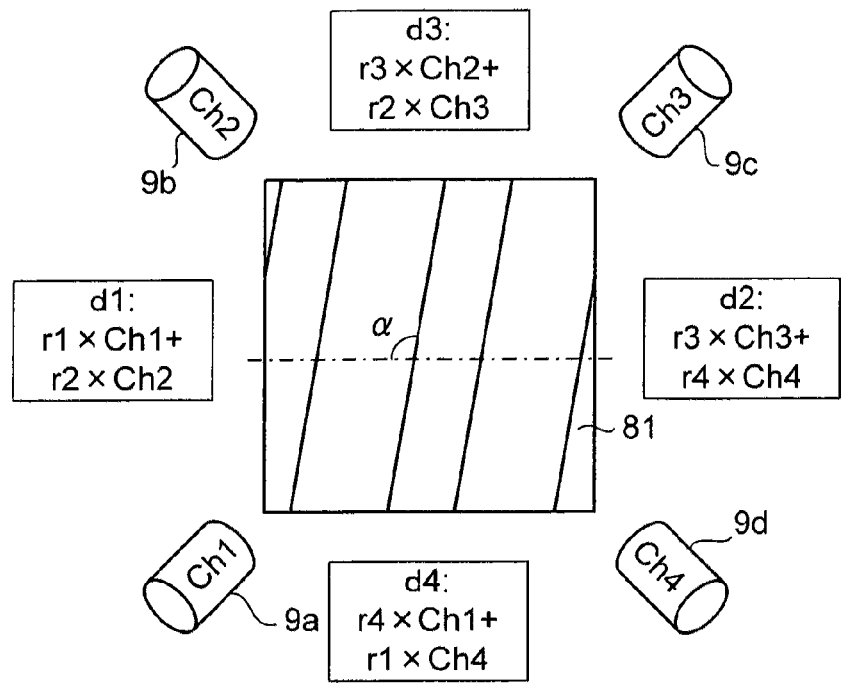
FIGS. 23A and 23B are schematic views for explaining a method of generating a left image, a right image, an upper image, and a lower image in the second embodiment.

FIG. 23A is a schematic view for explaining a method of generating a left image, a right image, an upper image, and a lower image, when the angle α of the line pattern is within a range of 45° to 135° in this embodiment. Moreover, the FIGS. 24A to 24D are views respectively showing coefficients r1 to r4 used to generate the left image, the right image, the upper image, and the lower image in this embodiment.

In step S55, the signal processing unit 11 generates the left image d1 as shown in FIG. 23A by adding the signal ch1 multiplied by the coefficient r1 and the signal ch2 multiplied by the coefficient r2. In addition, the signal processing unit 11 generates the right image d2 by adding the signal ch3 multiplied by the coefficient r3 and the signal ch4 multiplied by the coefficient r4.

Furthermore, the signal processing unit 11 generates the upper image d3 by adding the signal ch2 multiplied by the coefficient r3 and the signal ch3 multiplied by the coefficient r2, and generates the lower image d4 by adding the signal ch1 multiplied by the coefficient r4 and the signal ch4 multiplied by the coefficient r1.

As shown in FIGS. 24A to 24D, the coefficients r1 to r4 used to generate the images d1 to d4 periodically change within a range of 0 to 1 in accordance with the angle α of the line pattern. Here, the coefficients r1 and r3 are expressed as $(1+\sin 2\alpha)/2$, and the coefficients r2 and r4 are expressed as $(1-\sin 2\alpha)/2$.

Figure 24A:
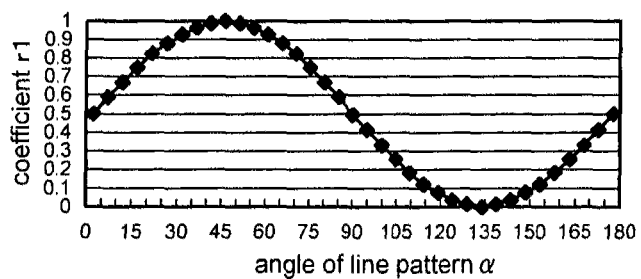
FIGS. 24A to 24D are graphs showing coefficients used to generate the left image, the right image, the upper image, and the lower image in the second embodiment.
Figure 24B:
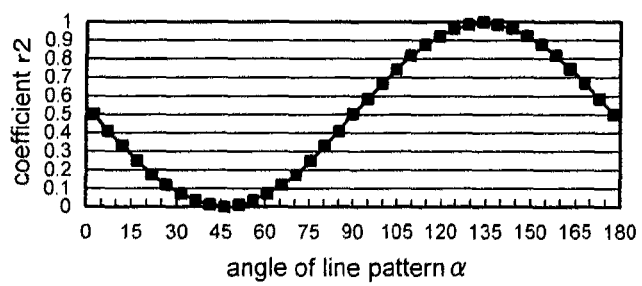
Figure 24C:
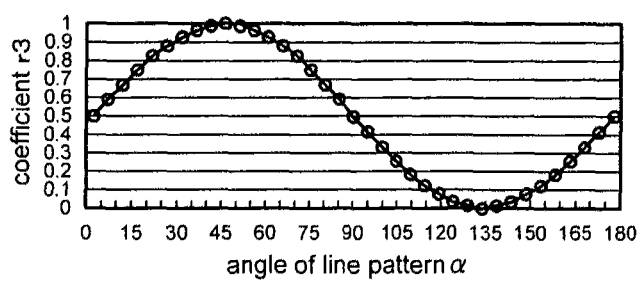
Figure 24D:
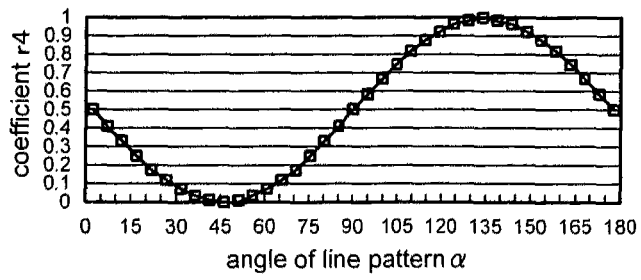

As shown in FIGS. 24B and 24C, regarding the coefficients r2 and r3 used to generate the upper image d3, as the angle α of the line pattern becomes closer to 135° being a direction in which the electron detector 9c is installed, the coefficient r2 for the signal ch3 increases and the coefficient r3 for the signal ch2 decreases. On the other hand, as the angle α of the line pattern becomes closer to 45° being a direction in which the electron detector 9b is installed, the coefficient r3 for the signal ch2 increases and the coefficient r2 for the signal ch3 decreases. Accordingly, as the angle α of the line pattern becomes closer to the direction in which the electron detector 9c is installed, a proportion of the signal ch3 from the electron detector 9c increases in the upper image d3. Meanwhile, as the angle α of the line pattern becomes closer to the direction in which the electron detector 9b is installed, a proportion of the signal ch2 from the electron detector 9b increases in the upper image d3.

Thus, a direction in which the upper image d3 of the observation region is taken changes depending on the angle α of the line pattern. Hence, the upper image d3 is an image taken in a direction parallel to the extending direction of the line pattern with the angle α within the range of 45° to 135°.

Similarly, the lower image d4 is an image taken in a direction parallel to the extending direction of the line pattern.

Meanwhile, the left image d1 and the right image d2 are images respectively taken in directions orthogonal to the extending direction of the line pattern.

As described above, in step S55, the signal processing unit 11 generates the upper image d3 and the lower image d4 taken in the directions parallel to the extending direction of the line pattern and the left image d1 and the right image d2 taken in the directions orthogonal to the extending direction of the line pattern.

When the signal processing unit 11 judges in step S54 of FIG. 21 that the angle α of the line pattern is not within a range of 45° to 135° (NO), i.e., when the angle α of the line pattern is within a range of 0° to 45° or within a range of 135° to 180°, the processing proceeds to step S56.

Figure 23B:
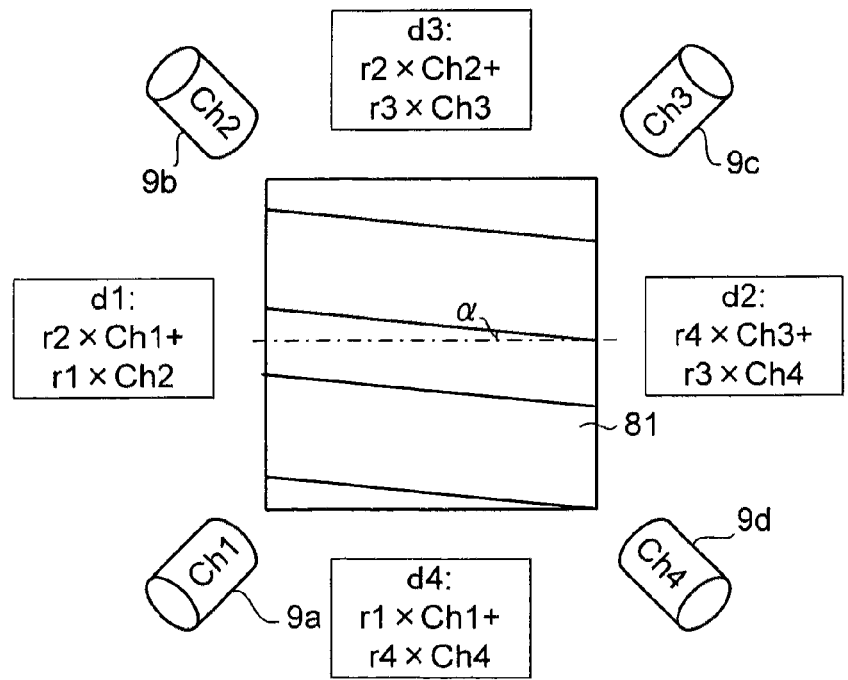

FIG. 23B is a schematic view for explaining a method of generating a left image, a right image, an upper image, and a lower image, when the angle α of the line pattern is within a range of 0° to 45° or within a range of 135° to 180°.

In step S56, the signal processing unit 11 generates the left image d1 as shown in FIG. 23B by adding the signal ch1 multiplied by the coefficient r2 and the signal ch2 multiplied by the coefficient r1. In addition, the signal processing unit 11 generates the right image d2 by adding the signal ch3 multiplied by the coefficient r4 and the signal ch4 multiplied by the coefficient r3.

Furthermore, the signal processing unit 11 generates the upper image d3 by adding the signal ch2 multiplied by the coefficient r2 and the signal ch3 multiplied by the coefficient r3, and generates the lower image d4 by adding the signal ch1 multiplied by the coefficient r1 and the signal ch4 multiplied by the coefficient r4.

Here, the left image d1 and the right image d2 are images taken in directions parallel to the extending direction of the line pattern, and the upper image d3 and the lower image d4 are images taken in directions orthogonal to the extending direction of the line pattern.

As described above, in step S56, the signal processing unit 11 generates the left image d1 and the right image d2 taken in the directions parallel to the extending direction of the line pattern and the upper image d3 and the lower image d4 taken in the directions orthogonal to the extending direction of the line pattern.

Thus, the generation of the images by the signal processing unit 11 (step S44, FIG. 20) is completed.

Next, the processing proceeds to step S45 in FIG. 20 and a defect is detected by a defect inspection unit 12 and a comparison inspection unit 13.

Figure 25:
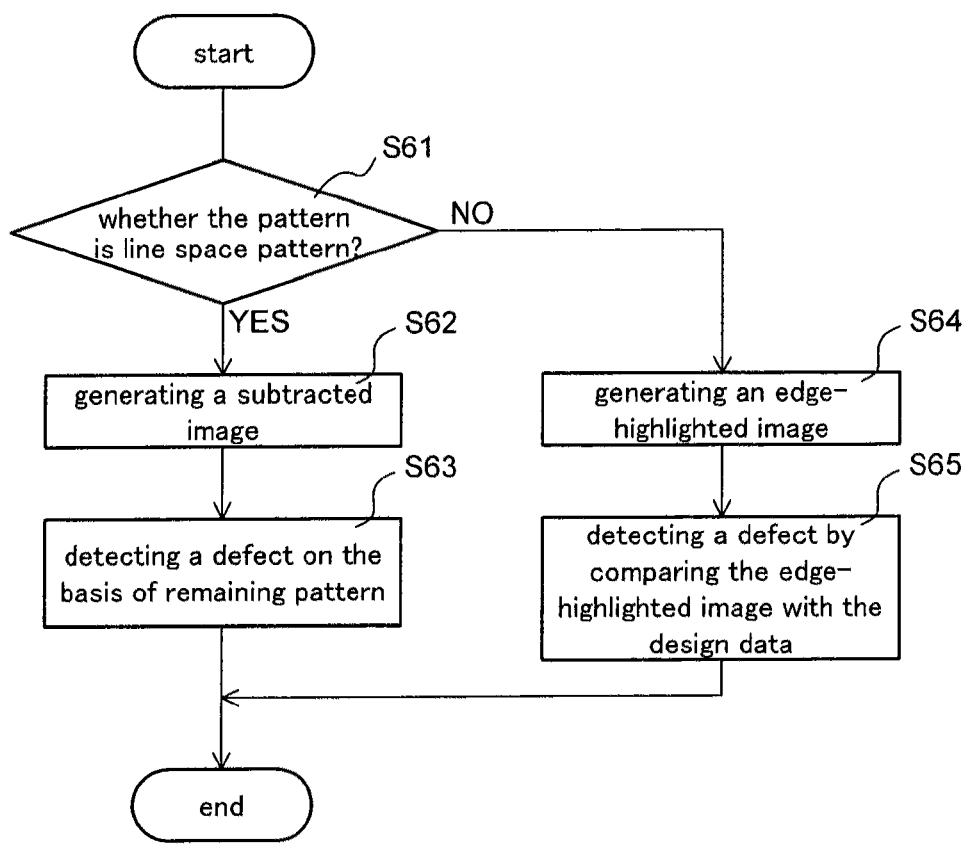
FIG. 25 is a flowchart showing a defect detection method according to the second embodiment.

FIG. 25 is a flowchart showing a defect detection method in step S45.

Firstly, in step S61 of FIG. 25, the defect inspection unit 12 judges whether or not the pattern of the observation region 81 is a line-and-space pattern. When the defect inspection unit 12 judges in step S61 that the pattern of the observation region 81 is a line-and-space pattern (YES), the processing proceeds to step S62.

Next, in step S62, the defect inspection unit 12 generates a subtract image by taking the subtract between two pieces of image data taken respectively in two directions which are parallel to the extending direction of the line pattern constituting the line-and-space pattern and which face each other with the optical axis of the electron beam 31 in between.

In this step, when the angle α of the line pattern is 0°<α<45° or 135°<α<180°, the subtract image is generated by taking the subtract between the left image d1 and the right image d2.

When the angle α of the line pattern is 45°<α<135°, the subtract image is generated by taking the subtract between the upper image d3 and the lower image d4.

When the angle α of the line pattern is 45°, the subtract image is generated by taking the subtract between the upper left image a2 and the lower right image a4. When the angle α of the line pattern is 135°, the subtract image is generated by taking the subtract between the lower left image a1 and the upper right image a3.

Thus, as described with reference to FIG. 7, the subtract image is obtained in which the edges of the line pattern is eliminated and only a defect 85 remains.

Next, in step S63 of FIG. 25, the defect inspection unit 12 detects a pattern remaining in the subtract image generated in step S62 as a defect. In this case, only the defect can be detected speedily by, for example, detecting edges with a luminance value equal to or higher than a predetermined value in the subtract image.

Meanwhile, in step S61, when the defect inspection unit 12 judges that the pattern of the observation region 81 is not a line-and-space pattern (NO), the processing proceeds to step S64 and an edge-emphasized image is generated by the comparison inspection unit 13.

Thereafter, in step S65, the comparison inspection unit 13 overlaps and compares the edge-emphasized image generated and the design data, and detects, as a defect, a portion in which edges in the edge-emphasized image are different from edges in the design data.

Thus, the detection of a defect is completed.

Thereafter, the processing proceeds to step S46 of FIG. 20, and a defect measuring unit 16 measures the protrusion or depression of the defect and the height of the defect. Note that, in this embodiment, the measurement of the protrusion or depression of the defect and the height of the defect by the defect measuring unit 16 is performed in the method described with reference to FIGS. 9A to 11E. In this case, the integration profile of a reference pattern can be obtained based on images respectively taken in two directions orthogonal to the extending direction of the line pattern.

As described above, according to this embodiment, an image taken in a direction parallel to the extending direction of a line pattern can be generated for a line pattern of any angle by multiplying each of signals from adjacent electron detectors by a coefficient which changes depending on the angle α of the line pattern and then adding the signals. Thus, a defect can be speedily detected based on the subtract image for a line pattern of any angle.

Example 3

A sample of Example 3 is one in which multiple line patterns each made of chrome (Cr) with a thickness of approximately 80 nm and with a width of approximately 400 nm are formed on a glass substrate, and a space with a width of approximately 400 nm is provided between each adjacent line patterns. In this example, the angle of the line pattern is set to 105°.

Figure 26A:
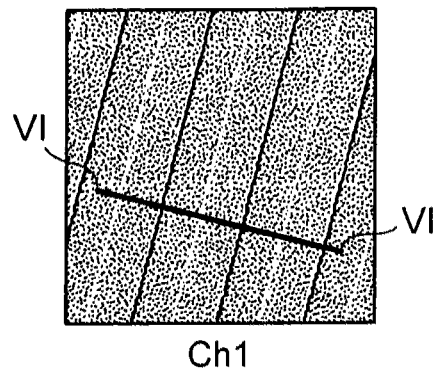
FIGS. 26A to 26D are views showing a lower left image, an upper left image, an upper right image, and a lower right image of a sample of Example 3, respectively.
Figure 26B:
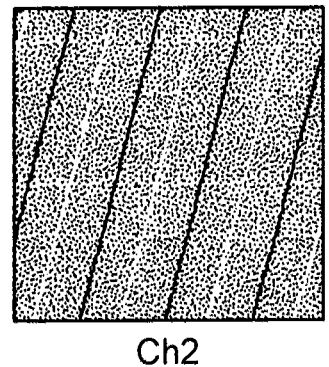
Figure 26C:
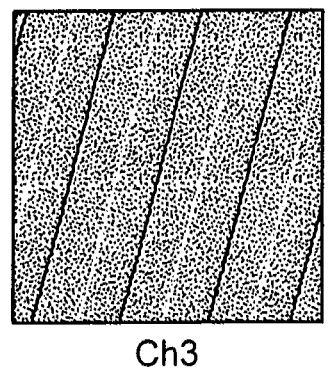
Figure 26D:
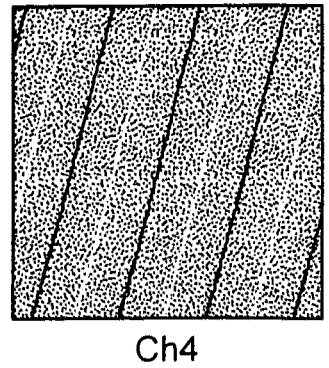

FIG. 26A shows a lower left image a1 of the sample of Example 3, FIG. 26B shows an upper left image a2 of the sample of Example 3, FIG. 26C shows an upper right image a3 of the sample of Example 3, and FIG. 26D shows a lower right image a4 of the sample of Example 3.

Next, the coefficients r1 and r3 are each set to 0.25, and the coefficients r2 and r4 are each set to 0.75. Then, the left image d1, the right image d2, the upper image d3, and the lower image d4 are generated by the method shown in FIG. 23A. Next, the distribution of luminance in a portion corresponding to a VI-VI line in FIG. 26A is extracted from each of the generated images d1 to d4.

Figure 27A:
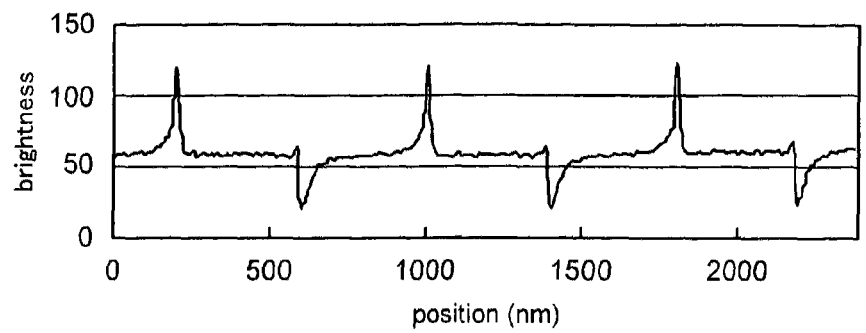
FIGS. 27A to 27D are graphs showing luminance distributions in a left image, a right image, an upper image, and a lower image of the sample of Example 3, respectively.
Figure 27B:
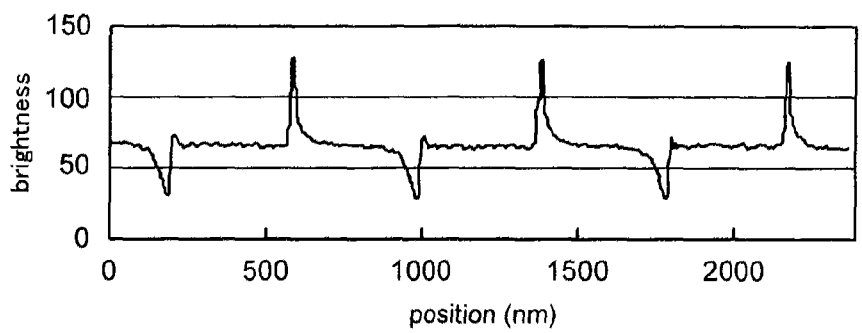
Figure 27C:
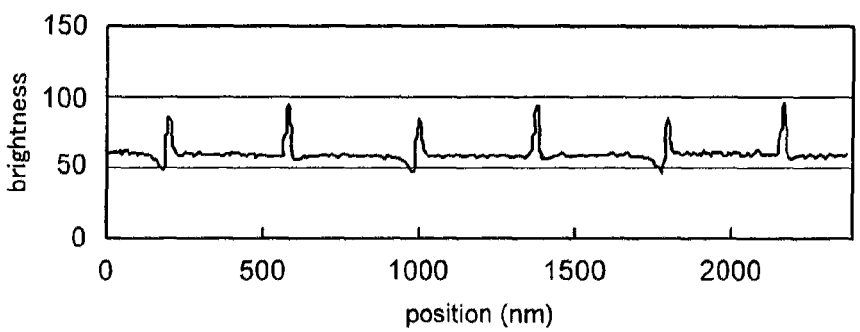
Figure 27D:
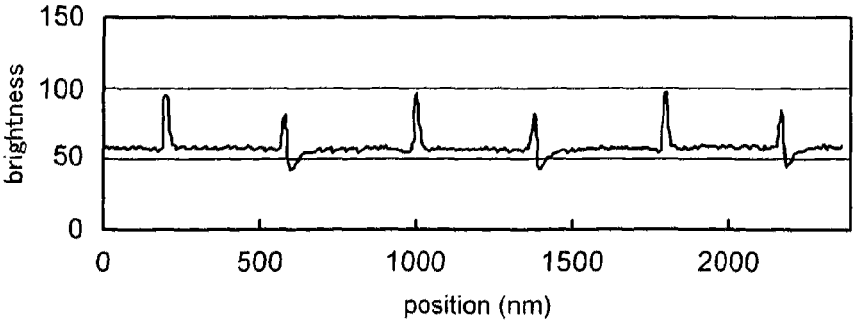

FIG. 27A shows the distribution of luminance in the left image d1, and FIG. 27B shows the distribution of luminance in the right image d2. Moreover, FIG. 27C shows the distribution of luminance in the upper image d3, and FIG. 27D shows the distribution of luminance in the lower image d4.

Next, the subtract between the luminance distribution in FIG. 27A and the luminance distribution in FIG. 27B is taken to obtain the subtract profile of the left image d1 and the right image d2. Moreover, the subtract between the luminance distribution in FIG. 27C and the luminance distribution in FIG. 27D is taken to obtain the subtract profile of the upper image d3 and the lower image d4.

Figure 28A:
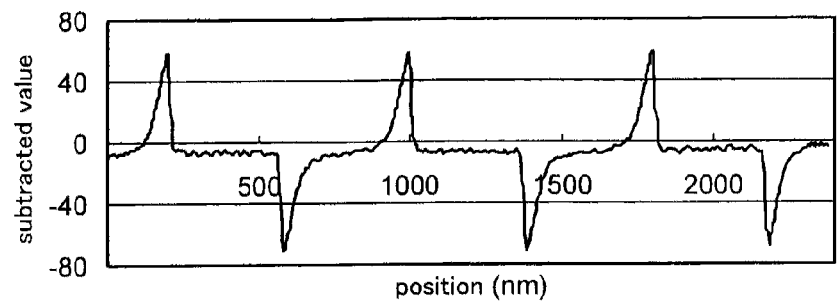
FIGS. 28A and 28B are graphs each showing a subtract profile of the sample of Example 3.
Figure 28B:
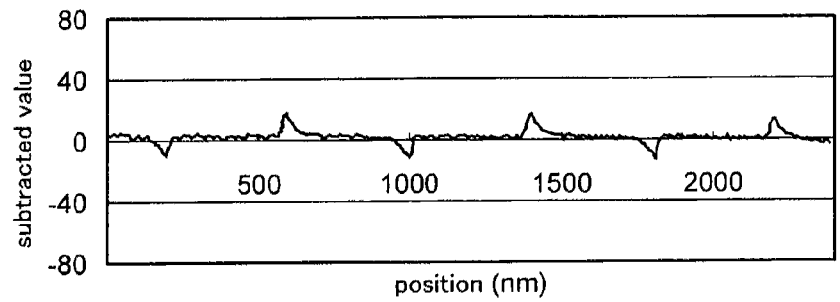

FIG. 28A shows the subtract profile of the left image d1 and the right image d2, and FIG. 28B shows the subtract profile of the upper image d3 and the lower image d4.

As shown in FIG. 28A, in the subtract profile of the left image d1 and the right image d2 which are taken in directions orthogonal to the extending direction of the line pattern, the edges of the line pattern is emphasized, and relatively large protrusions and depressions of the subtract value appear in edge portions.

In contrast, as shown in FIG. 28B, in the subtract profile of the upper image d3 and the lower image d4 which are taken in directions parallel to the extending direction of the line pattern, protrusions and recesses of the subtract value in edge portions of the line pattern are smaller than those in FIG. 28A, and the edges of the line pattern are almost totally eliminated.

From the above result, it has been found that the line pattern can be eliminated in the subtract image even when the angle α of the line pattern is 105°.

Figure 29:
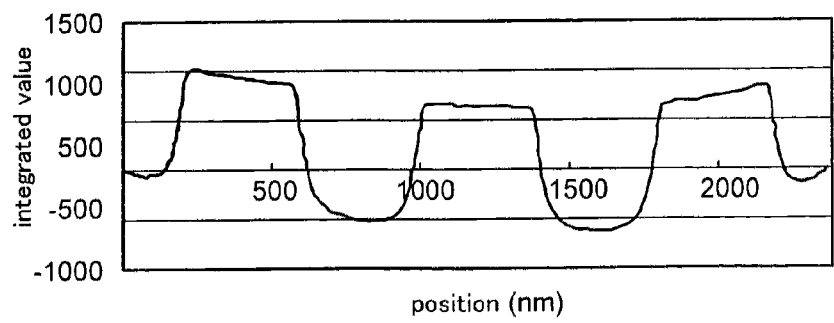
FIG. 29 is a graph showing an integration profile of the sample of Example 3.

Next, the subtract profile of the left image d1 and the right image d2 taken in directions orthogonal to the extending direction of the line pattern is integrated to obtain an integration profile. FIG. 29 shows the integration profile obtained by integrating the subtract profile of FIG. 28A.

As shown in FIG. 29, in the integration profile of the left image d1 and the right image d2 taken in directions orthogonal to the extending direction of the line pattern, the shape of the line pattern is reflected and the positive peaks appear. This integration profile can be used as the integration profile of the reference pattern to measure the height of the defect.

What is claimed is:

1. A defect review apparatus comprising:
   an electron scanning part which irradiates an observation region of a surface of a sample with an electron beam and which scans the electron beam over the observation region;
   a plurality of electron detectors which are arranged around an optical axis of the electron beam and which detect electrons emitted from the surface of the sample by the irradiation of the electron beam;
   a signal processing unit which generates a plurality of pieces of image data of the observation region on the basis of detection signals from the electron detectors, the plurality of pieces of image data respectively taken in different directions; and
   a defect inspection unit which generates a subtract image by taking a subtract between each two of the plurality of pieces of image data and which detects a defect in the observation region on the basis of the subtract image,
wherein when a pattern in the observation region is a line-and-space pattern including a line pattern and a space, the defect inspection unit generates the subtract image by taking the subtract between two pieces of the image data respectively taken in two directions which are parallel to an extending direction of the line pattern and face each other with the optical, axis of the electron beam in between, thereby canceling out images of only the line pattern, and then detects a pattern remaining in the subtract image as a defect.

2. The defect review apparatus according to claim 1, wherein the number of the electron detectors is at least two, and the electron detectors are arranged around the optical axis of the electron beam at intervals of an equal angle.

3. The defect review apparatus according to claim 2, wherein
the observation region is set in a rectangular shape, and
the number of the electron detectors is four, and the electron detectors are provided in directions along diagonal lines of the rectangular observation region.

4. The defect review apparatus according to claim 1, wherein the signal processing unit generates image data of the observation region by adding the detection signals of adjacent two of the electron detectors, the image data taken in a direction in the middle of the adjacent two of the electron detectors.

5. The defect review apparatus according to claim 1, further comprising a comparison inspection unit which detects the defect by comparing the image data of the observation region and design data representing a design pattern of the observation region when a pattern in the observation region is a pattern other than a line-and-space pattern.

6. The defect review apparatus according to claim 5, wherein the comparison inspection unit generates an edge-highlighted image in which an edge extending in an oblique direction is highlighted by adding an image obtained by taking a subtract between two pieces of the image data respectively taken in directions along one diagonal line of the observation region to an image obtained by taking a subtract between two pieces of image data respectively taken in directions along another diagonal line of the observation region, and then detecting the defect by comparing the edge of the pattern in the edge-highlighted image and the edge of the pattern in the design data.

7. The defect review apparatus according to claim 1, further comprising a defect measuring unit measuring an protrusion or depression defect wherein
the defect measuring unit obtains a subtract profile which indicates distribution of a subtract value between two pieces of image data respectively taken in two directions facing each other with the optical axis of the electron beam in between, further obtains an integration profile by integrating the subtract profile, and judges whether the defect is a depression or a protrusion on the basis of whether a shape of the integration profile reflecting the defect is a depression or a protrusion.

8. The defect review apparatus according to claim 7, wherein the defect measuring unit calculates a height of the defect by obtaining the integration profile of a reference pattern having a known height, and then comparing a peak value of the integration profile of the reference pattern and a peak value of the integration profile reflecting the defect.

9. The defect review apparatus according to claim 3, wherein the signal processing unit multiplies each of the detection signals from the adjacent electron detectors by a coefficient changing depending on an angle of the line pattern and adds the multiplied detection signals, thereby generating two pieces of image data of the observation region taken in two directions which are parallel to the extending direction of the line pattern and face each other with the optical axis of the electron beam in between.

10. A defect review method comprising the steps of:
irradiating and scanning a surface of a sample with an electron beam, and detecting electrons emitted from the surface of the sample by the irradiation of the electron beam with a plurality of electron detectors arranged around an optical axis of the electron beam;
generating a plurality of pieces of image data of the observation region on the basis of detection signals from the electron detectors, the plurality of pieces of image data taken in respective directions; and
generating a subtract image by taking a subtract between each two of the plurality of pieces of image data, and detecting a defect in the observation region on the basis of the subtract image,
wherein the step of generating a subtract image and detecting a defect includes the steps of:
generating the subtract image by taking the subtract between two pieces of the image data respectively taken in two directions which are parallel to an extending direction of a line pattern and face each other with the optical axis of the electron beam in between when a pattern in the observation region is a line-and-space pattern including the line pattern and a space, thereby canceling out images of only the line pattern, and
detecting a pattern remaining in the subtract image as the defect.

11. The defect review method according to claim 10, further comprising a step of detecting the detect by comparing the image data of the observation region and design data representing a design pattern of the observation region when a pattern in the observation region is a pattern other than a line-and-space pattern.

12. The defect review method according to claim 10 further comprising the step of measuring an protrusion or depression defect of the detected defect, wherein
the step of measuring the protrusion or depression defect includes the steps of:
obtaining a subtract profile which indicates distribution of a subtract value between two pieces of the image data respectively taken in two directions facing each other with the optical axis of the electron beam in between;
obtaining an integration profile by integrating the subtract profile; and
judging whether the defect is a depression or a protrusion on the basis of whether a shape of the integration profile reflecting the defect is a depression or a protrusion.

13. The defect review method according to claim 12, wherein
the step of measuring the protrusion or depression defect includes the steps of:
obtaining the integration profile of a reference pattern having a height already known; and
calculating a height of the defect by comparing a peak value of the integration profile of the reference pattern and a peak value of the integration profile reflecting the defect.

14. The defect review method according to claim 13, wherein in the step of generating pieces of image data, each of the detection signals from the adjacent electron detectors is multiplied by a coefficient changing depending on an angle of the line pattern and are added to each other, thereby generating two pieces of image data of the observation region taken in two directions which are parallel to the extending direction of the line pattern and face each other with the optical axis of the electron beam in between.

* * * * *